(12) United States Patent
Kim

(10) Patent No.: US 9,935,056 B2
(45) Date of Patent: Apr. 3, 2018

(54) SEMICONDUCTOR CHIP, METHOD OF MANUFACTURING THE SEMICONDUCTOR CHIP, AND SEMICONDUCTOR PACKAGE AND DISPLAY APPARATUS INCLUDING THE SEMICONDUCTOR CHIP

(71) Applicant: Samsung Electronics Co., Ltd., Suwon-si, Gyeonggi-do (KR)

(72) Inventor: Myoung-soo Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/349,490

(22) Filed: Nov. 11, 2016

(65) Prior Publication Data

US 2017/0148742 A1 May 25, 2017

(30) Foreign Application Priority Data

Nov. 24, 2015 (KR) .................. 10-2015-0164836

(51) Int. Cl.
| | |
|---|---|
| *H01L 23/544* | (2006.01) |
| *H01L 21/78* | (2006.01) |
| *H01L 21/48* | (2006.01) |
| *H01L 21/56* | (2006.01) |
| *H01L 23/00* | (2006.01) |

(Continued)

(52) U.S. Cl.
CPC ........ *H01L 23/544* (2013.01); *H01L 21/4853* (2013.01); *H01L 21/563* (2013.01); *H01L 21/78* (2013.01); *H01L 22/30* (2013.01); *H01L 24/16* (2013.01); *G09G 3/3648* (2013.01); *G09G 3/3677* (2013.01); *G09G 3/3688* (2013.01); *G09G 3/3696* (2013.01); *G09G 2300/0426* (2013.01); *G09G 2310/08* (2013.01); *H01L 22/34* (2013.01); *H01L 2223/5442* (2013.01); *H01L 2223/5446* (2013.01); *H01L 2223/54426* (2013.01); *H01L 2223/54453* (2013.01); *H01L 2224/16157* (2013.01)

(58) Field of Classification Search
USPC ........................................ 257/620
See application file for complete search history.

(56) References Cited

U.S. PATENT DOCUMENTS

| | | |
|---|---|---|
| 8,502,324 B2 | 8/2013 | Pol et al. |
| 8,987,867 B2 | 3/2015 | Lee et al. |

(Continued)

FOREIGN PATENT DOCUMENTS

| | | |
|---|---|---|
| KR | 10-1998-0029867 | 7/1998 |
| KR | 10-2003-0094454 | 12/2003 |

(Continued)

*Primary Examiner* — Marcos D Pizarro Crespo
*Assistant Examiner* — Lawrence Tynes, Jr.
(74) *Attorney, Agent, or Firm* — Myers Bigel, P.A.

(57) ABSTRACT

A semiconductor chip having an improved structure without an investment in photolithography equipment, a method of manufacturing the semiconductor chip, and a semiconductor package and a display apparatus which include the semiconductor chip are described. The semiconductor chip includes a circuit region disposed in a central part of a rectangle that is elongated in a first direction. The circuit region includes a plurality of driving circuit cells disposed at predetermined intervals in the first direction. A plurality of electrode pads is disposed around the circuit region, and a process pattern is disposed at at least one of the four sides of the rectangle.

17 Claims, 35 Drawing Sheets

(51) Int. Cl.
*H01L 21/66* (2006.01)
*G09G 3/36* (2006.01)

(56) References Cited

U.S. PATENT DOCUMENTS

| | | | |
|---|---|---|---|
| 2008/0087928 A1* | 4/2008 | Nagai | H01L 27/105 |
| | | | 257/295 |
| 2009/0057845 A1 | 3/2009 | Hong et al. | |
| 2011/0127646 A1 | 6/2011 | Kang et al. | |
| 2016/0268217 A1* | 9/2016 | Konomi | H01L 23/562 |

FOREIGN PATENT DOCUMENTS

| | | |
|---|---|---|
| KR | 10-2007-0077575 | 7/2007 |
| KR | 10-2008-0049372 | 6/2008 |
| KR | 10-2008-0090847 | 10/2008 |
| KR | 10-2009-0024408 | 3/2009 |
| KR | 10-2009-0076141 | 7/2009 |
| KR | 10-2010-0010841 | 2/2010 |
| KR | 10-2010-0020300 | 2/2010 |
| KR | 10-2014-0062331 | 5/2014 |

\* cited by examiner (Aku)

(Akt)

SEMICONDUCTOR CHIP, METHOD OF MANUFACTURING THE SEMICONDUCTOR CHIP, AND SEMICONDUCTOR PACKAGE AND DISPLAY APPARATUS INCLUDING THE SEMICONDUCTOR CHIP

CROSS-REFERENCE TO RELATED APPLICATION

This application claims the benefit of Korean Patent Application No. 10-2015-0164836, filed on Nov. 24, 2015, in the Korean Intellectual Property Office, the disclosure of which is incorporated herein in its entirety by reference.

BACKGROUND

The inventive concepts relate to semiconductor chips and semiconductor packages, and more particularly, to semiconductor chips and semiconductor packages which may be used for driving a display apparatus.

In general, a display apparatus may include a display panel for displaying images and a driving chip for driving pixels of the display panel. The driving chip may convert an image signal applied from the outside of the driving chip (e.g., from an external device) into a driving signal suitable for driving a pixel and may apply the driving signal to the pixel at an appropriate time. The driving chip may have a package structure, such as a tape carrier package (TCP), a chip on film (COF) package, or a chip on glass (COG) package.

SUMMARY

The inventive concepts provide semiconductor chips having a structure optimized without an investment in photolithography equipment, a method of manufacturing the semiconductor chip, and a semiconductor package and a display apparatus which include the semiconductor chip.

According to some embodiments of the inventive concepts, a semiconductor chip includes a circuit region having circuit patterns therein that are arranged along a first direction, conductive electrode pads that are electrically coupled to the circuit patterns and are arranged between a periphery of the circuit region and an edge of the semiconductor chip that extends along the first direction, and at least one process pattern on the semiconductor chip adjacent the periphery and outside of the circuit region. The at least one process pattern is electrically isolated from the circuit patterns and the conductive electrode pads.

According to some embodiments of the inventive concepts, there is provided a semiconductor chip including: a circuit region disposed in a central part of a rectangle that is long in a first direction, the circuit region including a plurality of driving circuit cells disposed at predetermined intervals in the first direction; a plurality of electrode pads disposed around the circuit region; and a process pattern disposed at at least one of the four sides of the rectangle.

According to some embodiments of the inventive concepts, there is provided a semiconductor chip including: a circuit region disposed in a central part of a rectangle, the circuit region including circuit patterns; and a process pattern disposed around the circuit region and at at least one of the four sides of the rectangle.

According to some embodiments of the inventive concepts, there is provided a method of manufacturing a semiconductor chip, the method including: forming circuit patterns in a plurality of chips having a form of a rectangle in a wafer and forming process patterns in a scribe lane of the wafer, wherein the circuit patterns and the process patterns are formed by performing a photolithography process on the wafer; forming electrode pads in each of the plurality of chips; and separating the plurality of chips from each other through a sawing process to individualize the plurality of chips, wherein in the forming of the circuit patterns and the process patterns, a main process pattern that is any one of the process patterns is included in at least one of the plurality of chips.

According to some embodiments of the inventive concepts, there is provided a semiconductor package including: a semiconductor chip including a circuit region disposed in a central part of a rectangle that is long in a first direction, a plurality of electrode pads disposed around the circuit region, and a process pattern disposed at at least one of the four sides of the rectangle; and a support substrate including a chip mounting unit, in which the semiconductor chip is mounted, and a plurality of wiring patterns electrically connected to the plurality of electrode pads.

According to some embodiments of the inventive concepts, there is provided a display apparatus including: a display panel configured to display an image; a printed circuit board (PCB) configured to provide a driving signal to a driving chip for displaying the image; and a semiconductor package connected between the PCB and the display, the semiconductor package including the driving chip and a support substrate on which the driving chip is mounted, wherein the driving chip includes a circuit region disposed in a central part of a rectangle that is long in a first direction, a plurality of electrode pads disposed around the circuit region, and a process pattern disposed at at least one of the four sides of the rectangle.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Figure 1:
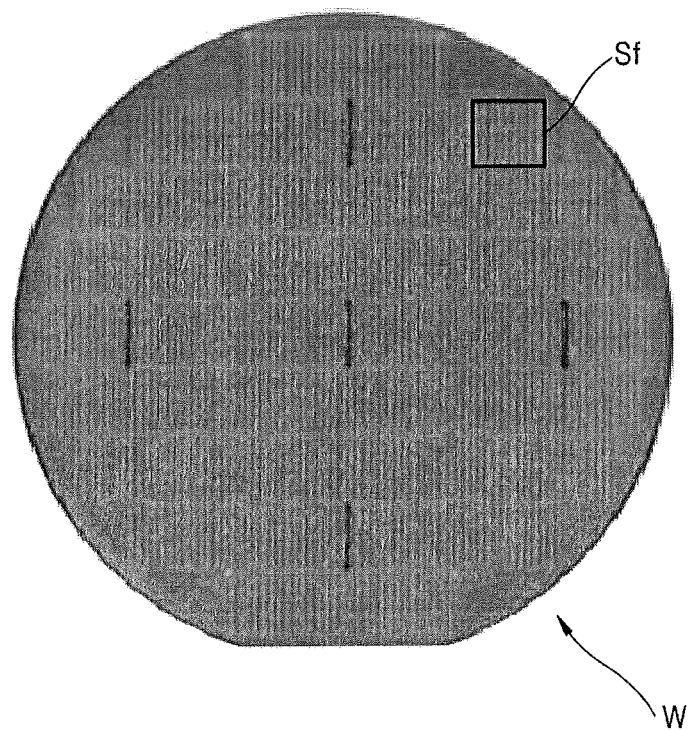
FIG. 1 is a plan view of a wafer including semiconductor chips according to some embodiments.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully hereinafter with reference to the accompanying drawings, in which embodiments of the inventive concepts are shown. These embodiments are provided so that this disclosure is thorough and complete and fully conveys the scope of the inventive concepts to one skilled in the art. Accordingly, while the inventive concepts can be modified in various ways and take on various alternative forms, specific embodiments thereof are shown in the drawings and described in detail below as examples. There is no intent to limit the inventive concepts to the particular forms disclosed. On the contrary, the inventive concepts are to cover all modifications, equivalents, and alternatives falling within the spirit and scope of the appended claims.

It will be understood that when an element is referred to as being "on" or "connected to" another element, it can be directly on or connected to the other element, or intervening elements may also be present. Also, in the drawings, the structures or sizes of the elements are exaggerated for clarity, and redundant descriptions thereof are omitted. Like reference numerals denote like elements in the drawings.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

Figure 2:
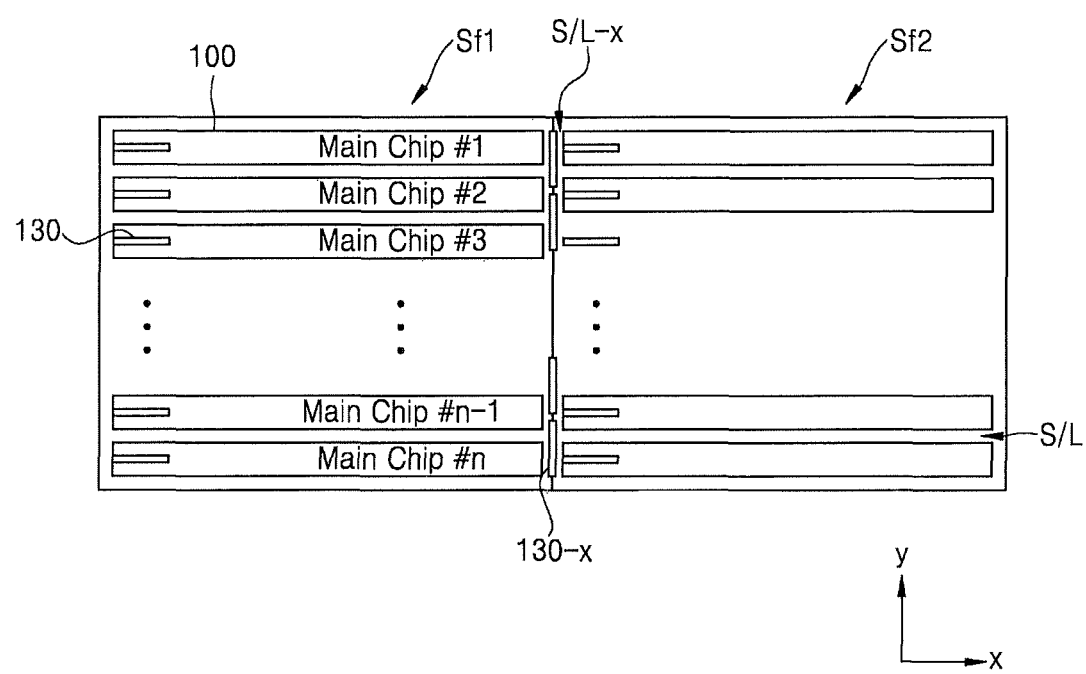
FIG. 2 is a plan view corresponding to a full-shot including semiconductor chips according to some embodiments.

FIG. 1 is a plan view of a wafer W including semiconductor chips according to some embodiments, and FIG. 2 is a plan view corresponding to a full-shot including semiconductor chips according to some embodiments.

Referring to FIGS. 1 and 2, a semiconductor chip 100 according to the current embodiment may have a rectangular structure that is long in one direction. For example, the semiconductor chip 100 may be a display driver integrated chip (DDI). However, the semiconductor chip 100 is not limited to a DDI. For example, the semiconductor chip 100 may be a memory chip or a non-memory chip other than a DDI. FIG. 1 is a view of the wafer W before semiconductor chips 100 are separated from each other and individualized through a sawing process, and the wafer W may include, for example, hundreds of semiconductor chips 100. The wafer W may include a plurality of main chips corresponding to the semiconductor chips 100 and a scribe lane S/L between the main chips. The scribe lane S/L is between the main chips to space the main chips apart from one another, and may correspond to a separation line for separating the main chips in the sawing process.

In general, patterns such as various marks or keys, which are used in a photolithography process, patterns for process monitoring, and patterns for a device test, may be formed in the scribe lane S/L. Such patterns do not influence the operation or functionality of the semiconductor chip 100, but may be used or may only be necessary to perform a semiconductor process. Thus, hereinafter, the patterns are referred to as 'process patterns' except for a clearly distinguished case. As such, the process patterns may be referred to herein as being electrically isolated from the functional elements of the semiconductor chip 100.

In terms of productivity, the width of the scribe lane is gradually decreasing, and thus, an area in which process patterns may be formed is also gradually decreasing. On the contrary, while semiconductor devices are highly integrated, types of the process patterns are gradually being diversified and the number of the process patterns is increasing. Accordingly, a wider area for the scribe lane may be required. In other words, a wider scribe lane may be required according to the high integration of semiconductor devices, whereas the width of the scribe lane and the area thereof on the wafer W have to be reduced in terms of productivity.

A square part indicated by a solid line on the wafer W may be a part corresponding to one full-shot Sf. The full-shot may correspond to the whole mask pattern that may be transferred through one scanning in an exposure process. In general, the exposure process may be performed by a reduction projection, for example, a reduction projection of 4:1. Accordingly, the mask pattern may be reduced to a quarter of the size thereof to be transferred onto a wafer. The full-shot may be referred to as full-field.

FIG. 2 shows two full-shots, that is, first and second full-shots Sf1 and Sf2, under magnification. For example, based on an x-axis scribe lane S/L-x extending in a second direction (y direction), a left part may correspond to the first full-shot Sf1 and a right part may correspond to the second full-shot Sf2. A y-axis scribe lane S/L may extend in a first direction (x direction) and be disposed along the second direction (y direction), and the x-axis scribe lane S/L-x may extend in the second direction (y direction) and be disposed along the first direction (x direction). However, the distinction between the x-axis scribe lane S/L-x and the y-axis scribe lane S/L is only arbitrary and may be changed according to an extending direction of the semiconductor chip 100. Since the y-axis scribe lane S/L will be mainly described below, a scribe lane may mean or refer to the y-axis scribe lane S/L (which extends along a length or longest dimension of the chip 100) unless otherwise defined.

As shown in FIG. 2, each of the first and second full-shots Sf1 and Sf2 may include a plurality of semiconductor chips 100 arranged in a line in the second direction (y direction). For example, as indicated by Main Chip #1 to Main Chip #n, each of the first and second full-shots Sf1 and Sf2 may include the plurality of semiconductor chips 100 arranged in a line in the second direction (y direction). When the semiconductor chips 100 are DDIs, each of the first and second full-shots Sf1 and Sf2 may generally include 20 to 30 semiconductor chips.

As shown in FIG. 2, each semiconductor chip 100 may include a process pattern 130 at at least one of four sides of the rectangular structure. For example, the semiconductor chip 100 may include the process pattern 130 at any of both short sides of the rectangular structure. The process pattern 130 may be any of the process patterns describe above. Accordingly, the process pattern 130 may not be formed in the scribe lane. As the process pattern 130 is not formed in the scribe lane S/L, the width of the scribe lane may be reduced, and thus, it is possible to increase the size of a main chip, i.e., the semiconductor chip 100, or increase the density or number of main chips in the wafer W. As a result, it is possible to increase the productivity of semiconductor chips that may be produced from one wafer. The increase in the size of the main chip and the increase in the number of main chips will be described with reference to FIGS. 3 to 5.

The process pattern 130 formed in the semiconductor chip 100 may be a process pattern having the largest size among process patterns that are formed in the scribe lane S/L. Specifically, the width of the scribe lane S/L may be determined by a process pattern having the largest size among process patterns that are disposed in the scribe lane S/L. For example, when a process pattern 'A' having the largest size among the process patterns has a width of about 60 μm in the second direction (y direction), the width of the scribe lane S/L in the second direction (y direction) has to be about 70 μm to 80 μm when considering a margin width with respect to the main chip.

In general, the sizes of most process patterns may be adjusted by a user. Accordingly, the process patterns may also follow a trend in which the sizes thereof are reduced depending on the high integration of the semiconductor chip 100. However, several process patterns may be dependent on semiconductor manufacturing equipment, and thus, the sizes of the several process patterns may not be reduced without replacing the semiconductor manufacturing equipment. However, since the replacement of the semiconductor manufacturing equipment may be a costly investment, it may be hard to adopt the replacement of the semiconductor manufacturing equipment. As an example, an alignment key 'S' that is used in a photolithography process may have a width of about 74 μm in the second direction (y direction) and a length of about 800 μm in the first direction (x direction). The alignment key 'S' is dependent on photolithography equipment, and thus, the sizes of the alignment key 'S' may not be reduced without replacing the photolithography equipment. Accordingly, due to the alignment key 'S', it may be difficult or almost impossible to reduce the width of the scribe lane S/L in the second direction (y direction) to less than about 80 μm.

However, in the semiconductor chip 100 according to the current embodiment, a process pattern 130 having the largest size, which acts as a bottleneck in reducing the width of the scribe lane S/L, is formed in the semiconductor chip 100 such that the scribe lane S/L is free of the process pattern 130, and thus, the width (or other dimension) of the scribe lane S/L may be reduced without an additional investment such as the replacement of semiconductor manufacturing equipment. Accordingly, the semiconductor chip 100 according to the current embodiment may contribute to increasing the size of a main chip or increasing the density or number of main chips in the wafer W, and thus, as a result, the productivity of semiconductor chips that may be produced from one wafer may be increased.

As shown in FIG. 2, all of the main chips in the full-shots Sf1 and Sf2 may include a process pattern 130. However, the inventive concepts are not limited thereto, and for example, the process pattern 130 may be omitted from some main chips. For example, in general, about 23 alignment keys having a larger or maximum size may be densely disposed in two adjacent scribe lanes S/L in a full-shot. Accordingly, when the number of alignment keys to be formed in main chips is limited to 23, corresponding alignment keys may not be formed in some main chips. However, since progress in processes may not be influenced although the number of alignment keys exceeds 23 and it may be advantageous in a patterning process to form alignment keys in a regular pattern, an alignment key may be formed in all of the main chips.

Process patterns 130-x may be formed also in the x-axis scribe lane S/L-x, and thus, a process pattern having the largest size among the process patterns 130-x may be disposed in a semiconductor chip to reduce the width of the x-axis scribe lane S/L-x in the first direction (x direction). However, as shown in FIG. 2, in one full-shot, y-axis scribe lanes S/L corresponding to the number of main chips may be disposed in the y-axis direction, but only one x-axis scribe lane S/L-x may be disposed in the x-direction. Accordingly, an effect on disposing a process pattern (i.e., the process pattern 130) having the largest size, which is disposed in the y-axis scribe lane S/L, in the semiconductor chip 100 may be more significant, whereas an effect on disposing a process pattern 130-x having the largest size, which is disposed in the x-axis scribe lane S/L-x, in the semiconductor chip 100 may be less significant.

Figure 3:
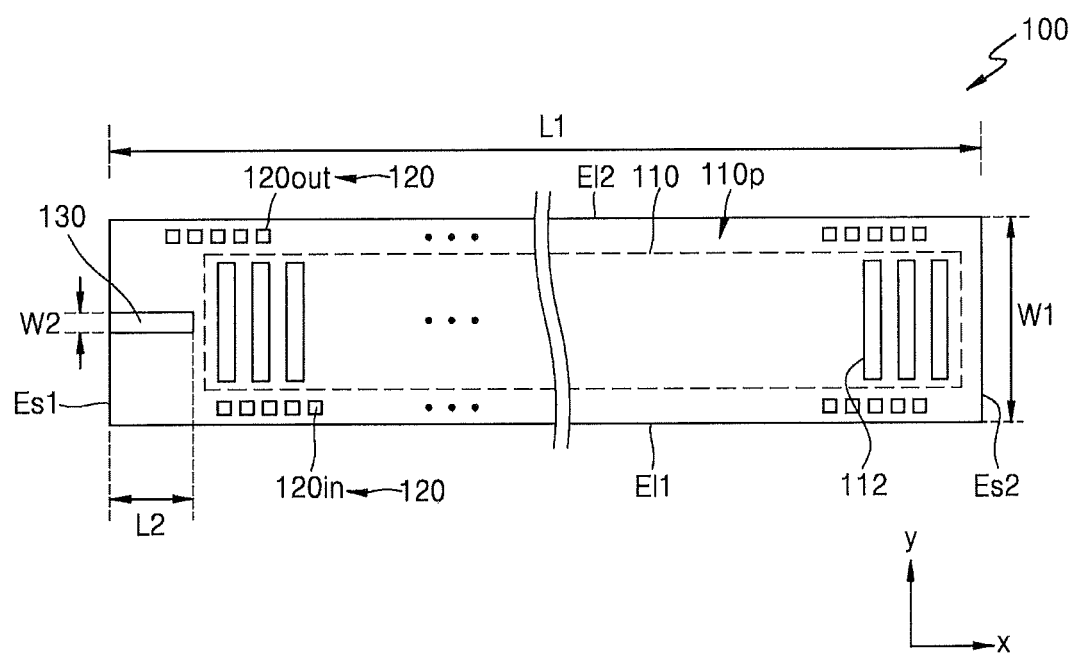
FIG. 3 is a plan view of a semiconductor chip according to some embodiments.
Figure 4:
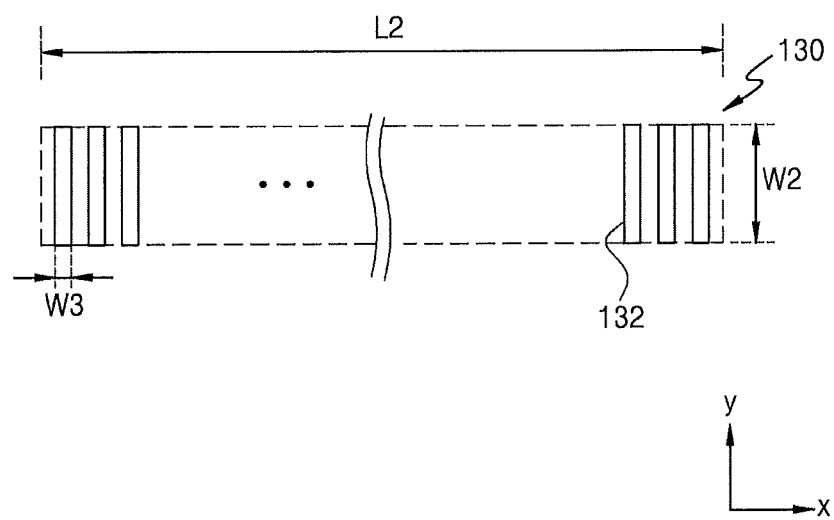
FIG. 4 is a plan view showing in more detail a process pattern in the semiconductor chip 100 of FIG. 3.
Figure 5:
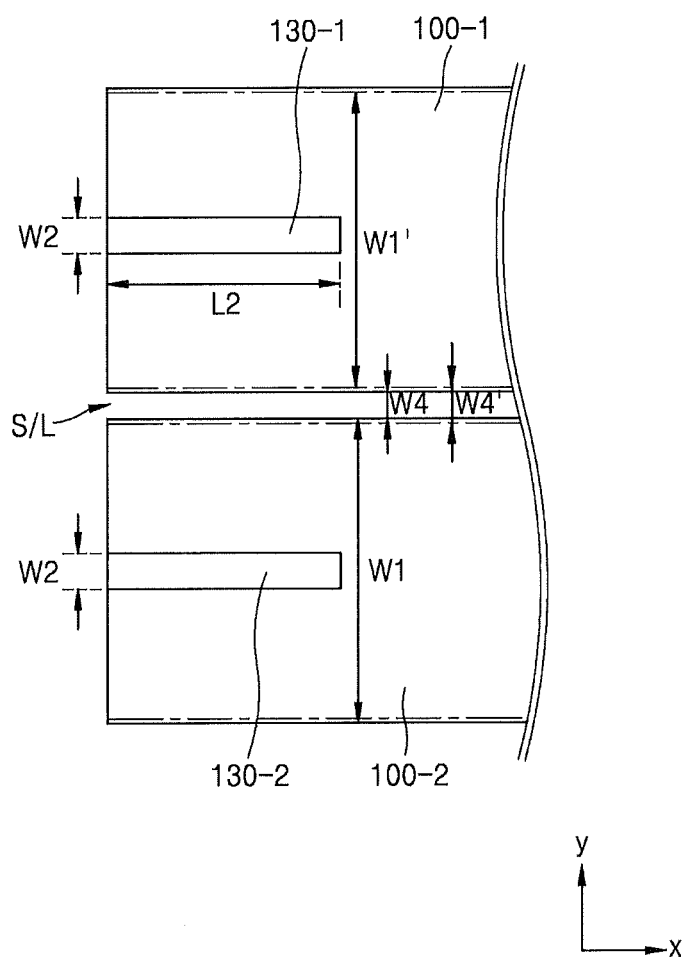
FIG. 5 is a plan view showing a state before the semiconductor chip of FIG. 3 is separated from a wafer.

FIG. 3 is a plan view of a semiconductor chip 100 according to some embodiments, FIG. 4 is a plan view showing in more detail a process pattern in the semiconductor chip 100 of FIG. 3, and FIG. 5 is a plan view showing a state before the semiconductor chip 100 of FIG. 3 is separated from a wafer. Descriptions provided above with reference to FIGS. 1 and 2 will be briefly provided or omitted.

Referring to FIGS. 3 to 5, the semiconductor chip 100 may include a circuit region 110, a peripheral region 110p, electrode pads 120, and a process pattern 130. The semiconductor chip 100 may be a DDI. However, the semiconductor chip 100 is not limited to a DDI. An example in which the semiconductor chip 100 is a DDI will be described with reference to FIGS. 3 to 5, and an example in which the semiconductor chip 100 is not a DDI will be described with reference to FIGS. 12A to 12C.

A plurality of driving circuit cells 112 may be disposed in the circuit region 110. Although not shown in FIGS. 3 to 5, a plurality of wiring patterns may also be disposed in the circuit region 110. The driving circuit cells 112 may be electrically connected to the electrode pads 120 via the wiring patterns. The driving circuit cells 112 may generate data signals for driving a display panel (e.g., a display panel 3000 of FIG. 18) in response to driving control signals and a power signal which are applied thereto via input electrode pads 120in from a printed circuit board (PCB) (e.g., a PCB 2000 of FIG. 18), and may output the data signals to output electrode pads 120out. For example, the driving circuit cells 112 may be formed according to the number of output electrode pads 120out.

Each of the driving circuit cells 112 may include a shift register, a data register, a line latch, a digital to analog (DA) converter, an output buffer, and the like. The shift register may generate a sequential latch pulse and provide the sequential latch pulse to the line latch. In other words, the shift register may generate a latch pulse by shifting, in response to a data clock signal, a horizontal start signal input from a timing controller (e.g., a timing controller 2100 of FIG. 19A) of the PCB (e.g., the PCB 2000 of FIG. 18) and provide the latch pulse to the line latch.

The data register may apply digital data signals that are sequentially input thereto, that is, red, green, and blue digital data signals, to the line latch. The line latch may latch the digital data signals by units of lines, and may output the latched digital data signals when a load signal is input thereto. The DA converter may convert a digital data signal, which is provided from the line latch, into an analog data signal (i.e., a data voltage), based on a gray scale voltage. The output buffer may adjust the analog data signal so that the level thereof approaches a reference level, and may output an adjusted analog data signal.

A level shifter, an amplifier, and the like are included in the DA converter and the output buffer, and the power signal from the PCB (e.g., the PCB 2000 of FIG. 18) may be applied to the level shifter and the amplifier.

The peripheral region 110p may be disposed around the circuit region 110, and the electrode pads 120 may be disposed in the peripheral region 110p. The peripheral region 110p may not be differentiated from the circuit region 110 by a physical boundary.

The electrode pads 120 may include the input electrode pads 120in and the output electrode pads 120out. The input electrode pads 120in may form an input unit along with connection terminals including bumps formed on the input electrode pads 120in, and the output electrode pads 120out may also form an output unit along with connection terminals corresponding to the output electrode pads 120out. For example, the input electrode pads 120in may be disposed along a first long side of the semiconductor chip 100, and the output electrode pads 120out may be disposed along a second long side El2 of the semiconductor chip 100.

The input electrode pads 120in include a plurality of signal input pads receiving driving control signals from the PCB and one or more power input pads receiving a power signal from the PCB. As described above, the output electrode pads 120out may be electrically connected to the driving circuit cells 112, and data signals generated by the driving circuit cells 112 may be output to the outside (e.g., to an external device) via the output electrode pads 120out.

In FIG. 3, the electrode pads 120 are disposed to be slightly spaced apart from the first long side El1 and the second long side El2 of the semiconductor chip 100. However, in some cases, the electrode pads 120 may be disposed to abut the first long side El1 and the second long side El2. In addition, when the semiconductor chip 100 is separated from a wafer, a connection terminal such as a bump may be formed on each of the electrode pads 120 in advance. Accordingly, the semiconductor chip 100 may include connection terminals on the electrode pads 120. Each of the connection terminals may include, for example, a gold (Au) bump.

The process pattern 130 may be disposed at a first short side Es1 that is the left side of the semiconductor chip 100. The process pattern 130 may also be disposed at a second short side Es2 that is the right side of the semiconductor chip 100. As described above with reference to FIGS. 1 and 2, the process pattern 130 may be one of various process patterns, and may be a process pattern having the largest size among the various process patterns. The size may denote a width in the second direction (y direction). As shown in FIG. 3, the process pattern 130 may have an elongated structure extending in the first direction (x direction). The size of the process pattern 130 may be very small, compared to the whole size of the semiconductor chip 100.

The semiconductor chip 100 may have a first length L1 in or extending along the first direction (x direction), and may have a first width W1 in or extending along the second direction (y direction). For example, the first length L1 may be tens of thousands of μm, and the first width W1 may be hundreds of μm. The process pattern 130 may have a second length L2 in or extending along the first direction (x direction), and may have a second width W2 in or extending along the second direction (y direction). For example, the second length L2 may be hundreds of μm, and the second width W2 may be tens of μm. Accordingly, the length (i.e., the second length L2) of the process pattern 130 in the first direction (x direction) may be several tens to several hundreds of the length (i.e., the first length L1) of the semiconductor chip 100 in the first direction (x direction), and the width (i.e., the second width W2) of the process pattern 130 in the second direction (y direction) may be several to several tens of the width (i.e., the first width W1) of the semiconductor chip 100 in the second direction (y direction).

As described above, as the process pattern 130 is formed in the semiconductor chip 100 such that the scribe lane S/L may be free thereof, and the scribe lane S/L may be reduced and the size of the semiconductor chip 100 may increase.

As shown in FIG. 5, two semiconductor chips, i.e., first and second semiconductor chips 100-1 and 100-2, may be disposed with a scribe lane S/L therebetween. In FIG. 5, an alternate long and short dash line may indicate a boundary between an existing or conventional scribe lane S/L and semiconductor chips, and a solid line may indicate a boundary between a scribe lane S/L having a reduced width in accordance with some embodiments of the inventive concepts and the first and second semiconductor chips 100-1 and 100-2.

Here, it is assumed that the width (i.e., a fourth width W4') of the existing or conventional scribe lane S/L in the second direction (y direction) is 100 μm, the length of the first semiconductor chip 100-1 in the first direction (x direction) is 30,000 μm, and the width (i.e., a first width W1') of the first semiconductor chip 100-1 in the second direction (y direction) is 1,000 μm. In addition, if it is assumed that a first process pattern 130-1, of which a length L2 in the first direction (x direction) is 1,000 μm and a width W2 in the second direction (y direction) is 100 μm, is formed in the first semiconductor chip 100-1 and the width (i.e., a fourth width W4) of the reduced scribe lane S/L in the second direction (y direction) is 80 μm, the size of the first semiconductor chip 100-1 may be increased by 20 μm (10 μm upward and 10 μm downward) in the second direction (y direction) and decreased by the size of the first process pattern 130-1. In other words, the area of the first semiconductor chip 100-1 may be increased by 500,000 μm² (20 μm*30,000 μm−100 μm*1,000 μm). The 500,000 μm² increase may correspond to an increase of about 1.7% of the area of an existing or conventional semiconductor chip.

As the process pattern 130 is formed in the semiconductor chip 100, the number or density of semiconductor chips 100 that may be produced in a wafer may also increase. For example, it is assumed that a maximum width of a full-shot in the second direction (y direction) is 30,000 μm, the width of an existing or conventional scribe lane S/L in the second direction (y direction) is 100 μm, and the size of the semiconductor chip 100 is 1,000 μm*30,000 μm. In addition, it is assumed that a process pattern of 100 μm*1,000 μm is formed in the semiconductor chip 100 and the width of the scribe lane S/L in the second direction (y direction) decreases to 80 μm, and the width of the semiconductor chip 100 in the second direction (y direction) is not changed.

In the case of an existing or conventional semiconductor chip in which a process pattern is not formed, 27.3 (30,000/(1000+100)≈27.3) semiconductor chips may be disposed in one full-shot. On the other hand, in the case of a semiconductor chip in which a process pattern is formed, 27.7 (30,000/(1000+80)≈27.7) semiconductor chips may be disposed in one full-shot. Accordingly, although the number or density of semiconductor chips that may be disposed in one full-shot may not substantially increase, several more semiconductor chips may be further disposed in the entire wafer when considering the entire wafer. Due to the reduction in the width of the scribe lane S/L, the width of a pair, which includes one semiconductor chip and one scribe lane S/L, in the second direction (y direction) may be reduced by 20 μm, and thus, the width of the pair in the second direction (y direction) is 1080 μm. Accordingly, one additional semiconductor chip may be further disposed per 54 semiconductor chips (1080/20=54). Accordingly, if about 100 existing or conventional semiconductor chips in which a process pattern is not formed are disposed in the second direction (y direction) in a wafer, about two additional semiconductor chips may be further disposed in the second direction (y direction) in a wafer in the case of a semiconductor chip in which a process pattern has been formed.

The process pattern 130 in the semiconductor chip 100 may be an alignment key that is used in a photolithography process. FIG. 4 shows a structure of the alignment key in more detail. As shown in FIG. 4, the process pattern 130 may have a structure in which a plurality of rod-shaped metal layers 132 are disposed in the first direction (x direction) and spaced apart at regular or uniform intervals. Each of the metal layers 132 may have a third width W3 in the first direction (x direction), and may have a second width W2 in the second direction (y direction). The width of each metal layer 132 in the second direction (y direction), that is, the second width W2, may correspond to the width of the process pattern 130 in the second direction (y direction). In addition, the sum of the widths of the metal layers 132 and intervals between the metal layers 132 in the first direction (x direction) may correspond to the length of the process pattern 130 in the first direction (x direction), that is, a second length L2.

The process pattern 130 corresponding to an alignment key may be dependent on photolithography equipment, and thus, the size of the process pattern 130 may not be reduced without replacing the photolithography equipment. Accordingly, if the process pattern 130 is disposed in the scribe lane S/L, the process pattern 130 may act as a bottleneck in reducing the width of the scribe lane S/L. On the other hand, in the current embodiment, the process pattern 130 is disposed in the semiconductor chip 100, and thus, the width of the scribe lane S/L may be reduced without being limited by the process pattern 130. Accordingly, it is possible to increase the size of the semiconductor chip 100 or increase the number or density of semiconductor chips that may be disposed in a wafer. The process pattern 130 that is formed in the semiconductor chip 100 is not limited to an alignment key that is used in a photolithography process.

FIGS. 6 to 8B are partial plan views of semiconductor chips 100a to 100e according to embodiments. FIG. 7B is a plan view showing the magnification of a section A of FIG. 7A. Descriptions provided with reference to FIGS. 1 to 5 will be briefly provided or omitted.

Figure 6:
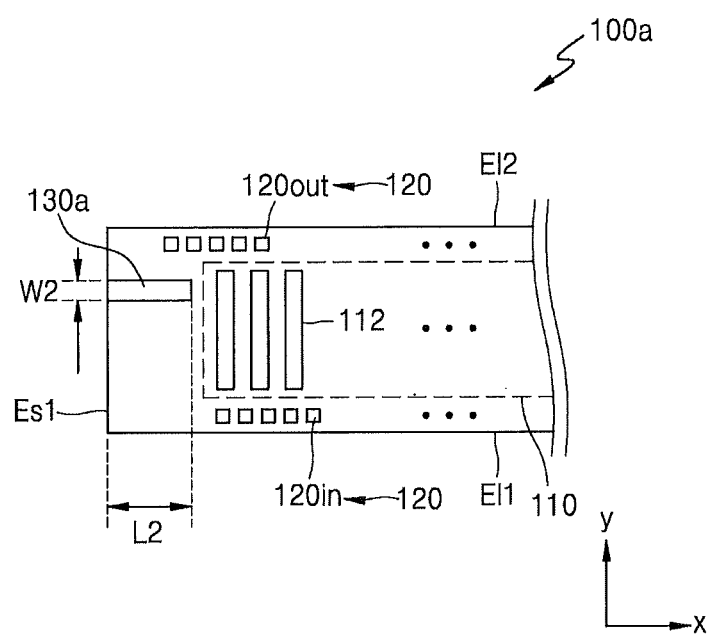
FIGS. 6 to 8B are partial plan views of semiconductor chips according to embodiments.

Referring to FIG. 6, the position of a process pattern 130a in the semiconductor chip 100a according to the current embodiment may be different from that of the process pattern 130 in the semiconductor chip 100 of FIG. 3. In the semiconductor chip 100 of FIG. 3, the process pattern 130 may be disposed at the first side Es1 and be positioned in an intermediate area or midpoint between the first long side El1 and the second long side El2. However, in the semiconductor chip 100a, the process pattern 130a may be closer to a second long side El1 and be positioned at a first side Es1. Alternatively, the process pattern 130a may be closer to a first long side El1 and be position at the first side Es1. More generally, the process pattern 130a may be disposed at any position of the first side Es1 of the semiconductor chip 100a. Likewise, the process pattern 130a may be disposed at any position of the second side Es2 of the semiconductor chip 100a.

In FIG. 3 or 6, the process pattern 130 or 130a is disposed to abut the first side Es1. However, in some cases, the process pattern 130 or 130a may be disposed to be slightly separated from the edge of the first side Es1. When the process pattern 130 or 130a is disposed to be slightly separate from the first side Es1, a burr phenomenon in which a metal layer of the process pattern 130 or 130a lifts off in a sawing process may be reduced or prevented.

Figure 7A:
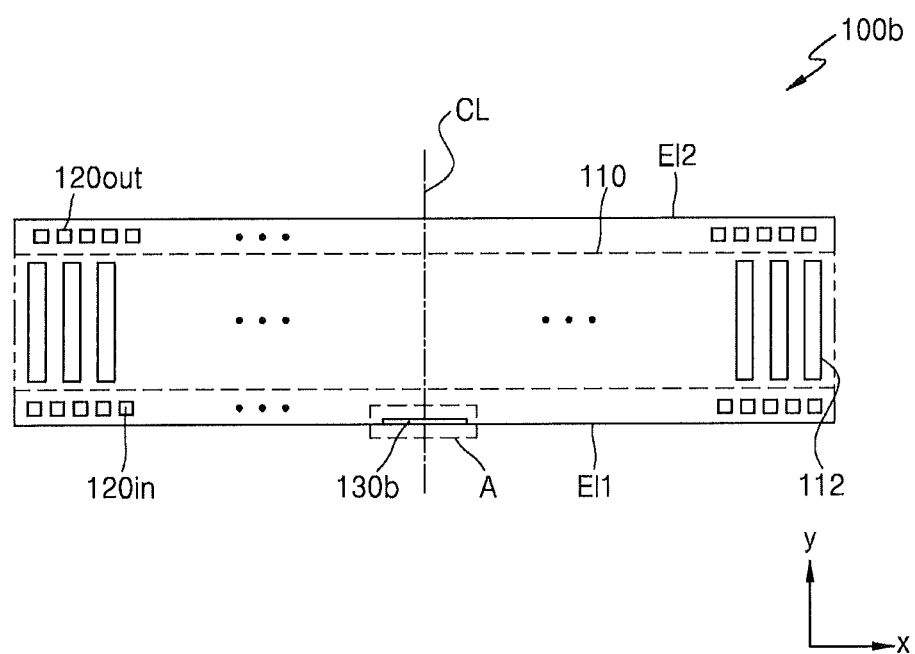
Figure 7B:
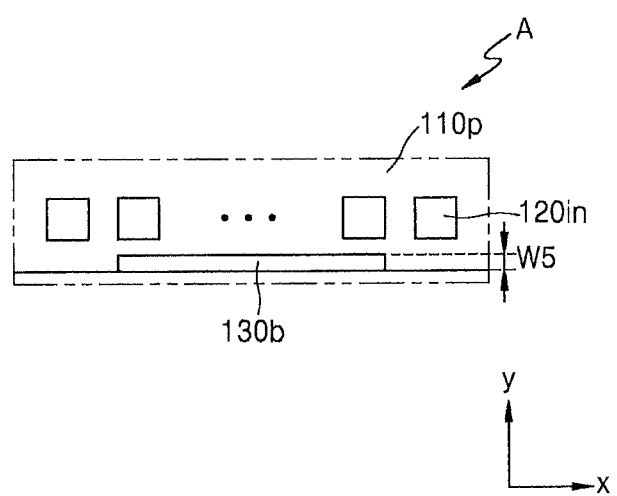

Referring to FIGS. 7A and 7B, the position and the side of a process pattern 130b in the semiconductor chip 100b according to the current embodiment may be different from those of the process pattern 130 in the semiconductor chip 100 of FIG. 3. Specifically, in the semiconductor chip 100b, the process pattern 130b may not be disposed at a short side of the semiconductor chip 100b but at the edge of a long side of the semiconductor chip 100b. For example, the process pattern 130b may be disposed at a central portion of the edge of a first long side El1 of the semiconductor chip 100b. The process pattern 130b may be disposed at a central portion of the edge of a second long side El2 of the semiconductor chip 100b. An alternate long and short dash line CL crossing the semiconductor chip 100b in the second direction (y direction) may correspond to a central line of the semiconductor chip 100b.

The size of the process pattern 130b in the semiconductor chip 100b may be smaller than that of the process pattern 130 in the semiconductor chip 100 of FIG. 3. For example, the length of the process pattern 130b in the first direction (x direction) may be the second length L2 that is the same as the length of the process pattern 130 in the semiconductor chip 100 of FIG. 3. However, the width of the process pattern 130b in the second direction (y direction) may be a fifth width W5 that is smaller than the width of the process pattern 130 in the semiconductor chip 100 of FIG. 3.

The fifth width W5 of the process pattern 130b may correspond to a reduction in the width of the scribe lane S/L) in the second direction (y direction). For example, when the width of the scribe lane S/L in the second direction (y direction) is reduced by about 20 μm while the semiconductor chip 100b is formed, the fifth width W5 of the process pattern 130b may correspond to about 20 μm.

One reason why the size of the process pattern 130b in the semiconductor chip 100b is small is because the entire process pattern such as an alignment key may extend on or be shared between both the scribe lane S/L and the semiconductor chip 100b, and a portion of the process pattern may remain in the semiconductor chip 100b while the other portion of the process pattern in the scribe lane S/L may be removed in a sawing process. Details related to the size of the process pattern 130b will be described with reference to FIG. 9A below.

Figure 7C:
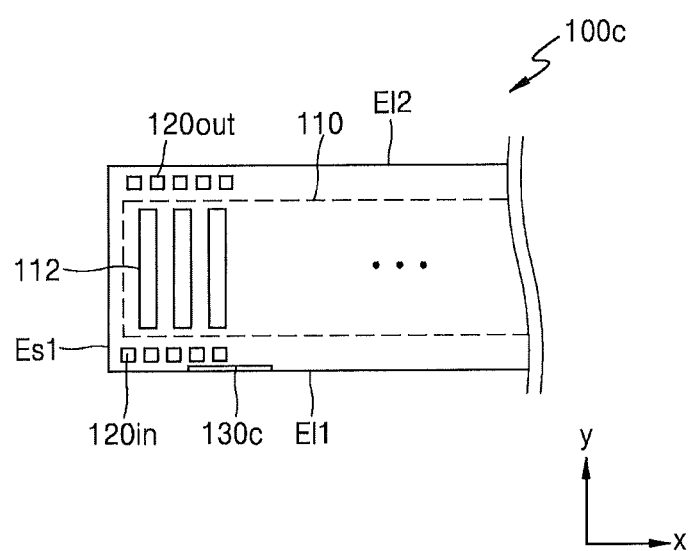

Referring to FIG. 7C, the semiconductor chip 100c according to the current embodiment may be similar to the semiconductor chip 100b of FIG. 7A in that a process pattern 130c is disposed at a long side of the semiconductor chip 100c. However, the semiconductor chip 100c may be different from the semiconductor chip 100b of FIG. 7A in that the process pattern 130c is not disposed at a central portion of the semiconductor chip 100c but at an area between a short side or edge of the semiconductor chip 100c and the central portion. For example, in the semiconductor chip 100c, the process pattern 130c may be closer to a first short side Es1 and be disposed at or abutting a first long side El1. Alternatively, the process pattern 130c may be close to a second short side Es2 and be disposed at or abutting the first long side El1. The size of the process pattern 130c of the semiconductor chip 100c may be the same as described for the semiconductor chip 100b of FIG. 7A.

Figure 8A:
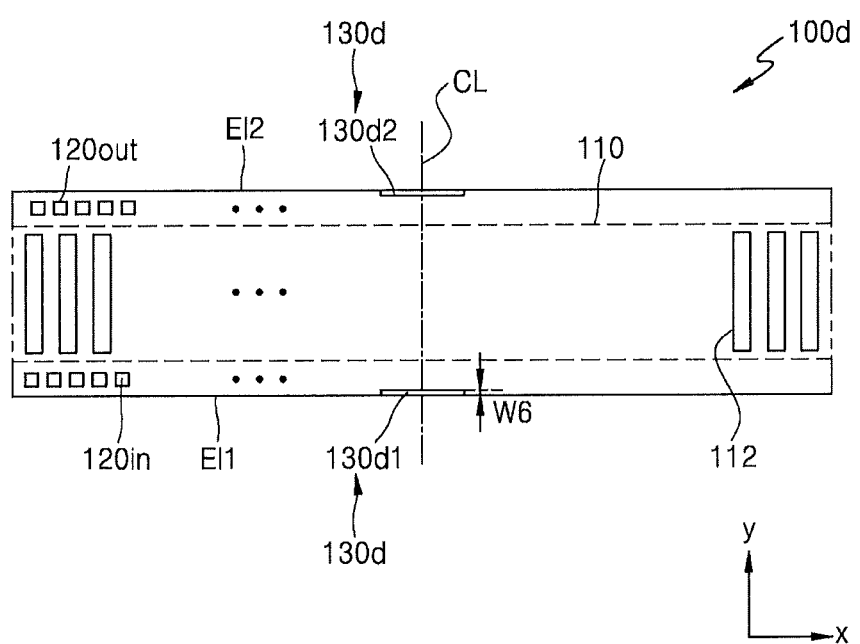

Referring to FIG. 8A, the semiconductor chip 100d according to the current embodiment may be similar to the semiconductor chip 100b of FIG. 7A in that a process pattern 130d is disposed at or abutting a long side of the semiconductor chip 100d. However, the semiconductor chip 100d may be different from the semiconductor chip 100b of FIG. 7A in that the process pattern 130d is disposed at a first long side El1 and a second long side El2 of the semiconductor chip 100d. The size of the process pattern 130d may be smaller than that of the process pattern 130b of the semiconductor chip 100b.

More specifically, in the semiconductor chip 100d, a lower process pattern 130d1 may be disposed at a central portion of the first long side El1 of the semiconductor chip 100d, and an upper process pattern 130d2 may be disposed at a central portion of the second long side El2 of the semiconductor chip 100d. The length of each of the lower and upper process patterns 130d1 and 130d2 in the first direction (x direction) may be a second length L2 that is the same as the length of the process pattern 130b in the semiconductor chip 100b of FIG. 7A. The width of each of the lower and upper process patterns 130d1 and 130d2 in the second direction (y direction) may be a sixth width W6 that is smaller than the fifth width W5 of the process pattern 130b in the semiconductor chip 100b of FIG. 7A.

The sixth width W6 of each of the lower and upper process patterns 130d1 and 130d2 may correspond to a half of a reduction in the width of the scribe lane S/L in the second direction (y direction). For example, when the width of the scribe lane S/L in the second direction (y direction) is reduced by about 20 μm while the semiconductor chip 100d is formed, the sixth width W6 of each of the lower and upper process patterns 130d1 and 130d2 may correspond to about 10 μm.

One reason why the sizes of the lower and upper process patterns 130d1 and 130d2 in the semiconductor chip 100d are smaller than that of the process pattern 130b of the semiconductor chip 100b of FIG. 7A is because the entire process pattern may extend on or be shared between a scribe lane S/L and each of the two semiconductor chips 100d adjacent to the scribe lane S/L and a portion of the process pattern may remain in each of the two semiconductor chips 100d as the other portion of the entire process pattern in the scribe lane S/L is removed in a sawing process. In addition, when the entire process pattern is formed in a scribe lane S/L between two semiconductor chips 100d and the two semiconductor chips 100d, a process pattern may not be formed in a scribe lane S/L adjacent to at least one of top and bottom chips in a full-shot. Accordingly, only one of the lower and upper process patterns 130d1 and 130d2 may be formed in the at least one of the top and bottom chips.

In the semiconductor chip 100d, the width of the lower process pattern 130d1 in the second direction (y direction) is the same as that of the upper process pattern 130d2 in the second direction (y direction). However, the inventive concepts are not limited thereto. For example, in the semiconductor chip 100d, the width of the lower process pattern 130d1 in the second direction (y direction) may be different from that of the upper process pattern 130d2 in the second direction (y direction). When the width of the lower process pattern 130d1 in the second direction (y direction) is different from that of the upper process pattern 130d2 in the second direction (y direction), the sum of the width of the lower process pattern 130d1 and the width of the upper process pattern 130d2 in the second direction (y direction) may correspond to a reduction in the width of the scribe lane S/L in the second direction (y direction).

Details related to the sizes of the upper and lower process patterns 130d1 and 130d2 will be described with reference to FIG. 9B below.

Figure 8B:
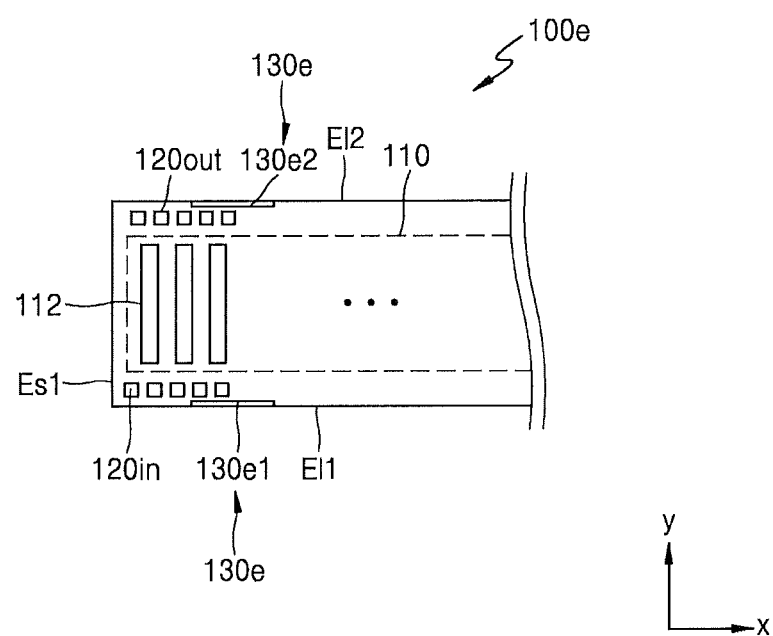

Referring to FIG. 8B, the semiconductor chip 100e according to the current embodiment may be similar to the semiconductor chip 100d of FIG. 8A in that a process pattern 130e is disposed at a first long side El1 and a second long side El2 of the semiconductor chip 100e. However, the semiconductor chip 100e may be different from the semiconductor chip 100d of FIG. 8A in that the process pattern 130e is not disposed at a central portion of the semiconductor chip 100e but at an area between a short side of the semiconductor chip 100e and the central portion. For example, in the semiconductor chip 100e, lower and upper process patterns 130e1 and 130e2 may be closer to a first short side Es1 and disposed at or abutting the first and second long sides El1 and El2, respectively. Alternatively, the lower and upper process patterns 130e1 and 130e2 may be closer to a second short side Es2 and disposed at or abutting the first and second long sides El1 and El2, respectively. The size of the process pattern 130e of the semiconductor chip 100e may be the same as described for the semiconductor chip 100d of FIG. 8A.

Figure 9A:
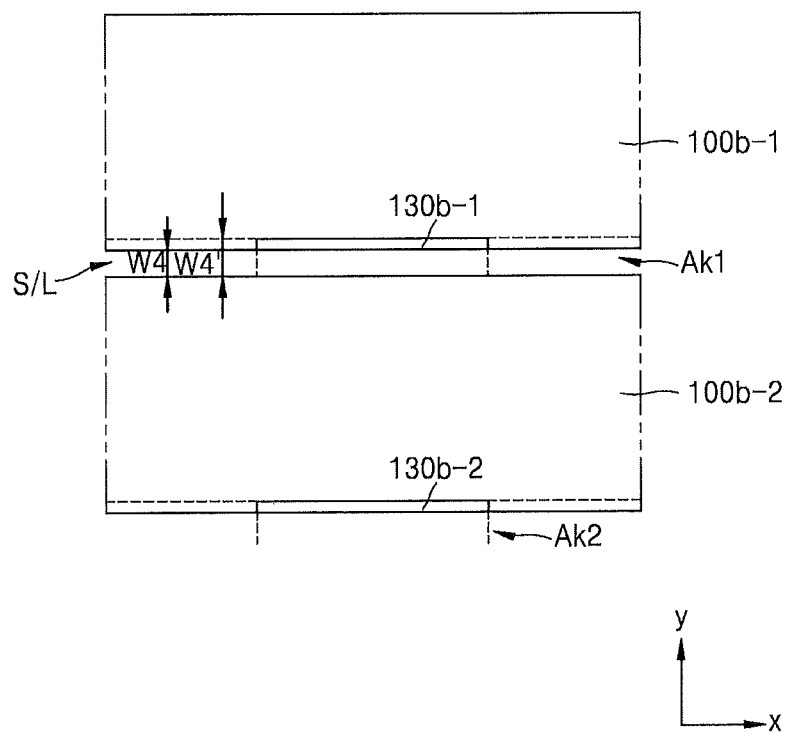
FIG. 9A is a plan view partially showing a state before the semiconductor chip of FIG. 7A is separated from a wafer.
Figure 9B:
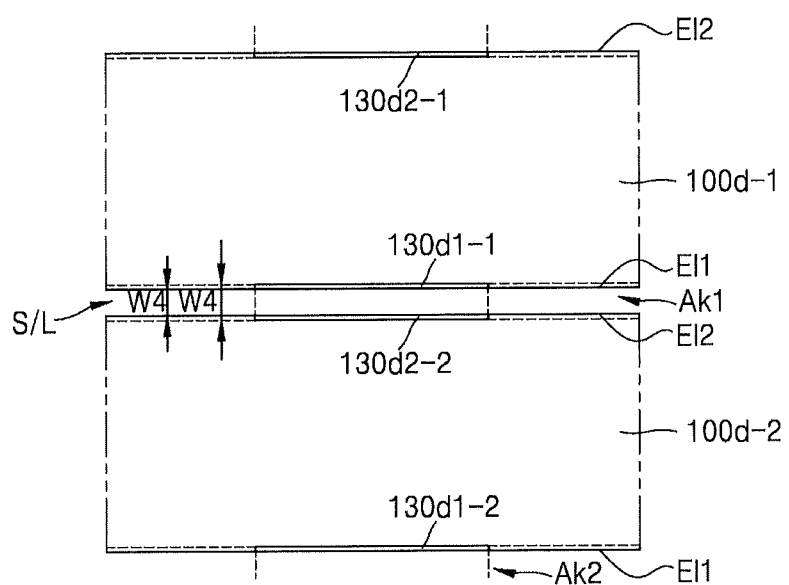
FIG. 9B is a plan view partially showing a state before the semiconductor chip of FIG. 8A is separated from a wafer.

FIG. 9A is a plan view partially showing a state before the semiconductor chip 100b of FIG. 7A is separated from a wafer, and FIG. 9B is a plan view partially showing a state before the semiconductor chip 100d of FIG. 8A is separated from a wafer.

Referring to FIG. 9A, two semiconductor chips, i.e., first and second semiconductor chips 100b-1 and 100b-2, may be disposed with a scribe lane S/L therebetween. In FIG. 9A, a dashed line may indicate a boundary between an existing or conventional scribe lane S/L and the semiconductor chips 100b-1 and 100b-2, and a solid line may indicate a boundary between a reduced scribe lane S/L, of which a width has been reduced, and the semiconductor chips 100b-1 and 100b-2.

As described above, each of the entire process patterns, i.e., first and second entire process patterns Ak1 and Ak2, such as an alignment key, may be shared between the scribe lane S/L and any of the two semiconductor chips 100b-1 and 100b-2 adjacent to the scribe lane S/L. For example, the first entire process pattern Ak1 may be shared between the scribe lane S/L and the first semiconductor chip 100b-1 adjacent to the scribe lane S/L. As the scribe lane S/L is removed in a sawing process after the first entire process pattern Ak1 is disposed, a first process pattern 130b-1 may be formed in the first semiconductor chip 100b-1. Accordingly, the width of the first process pattern 130b-1 in the second direction (y direction) may correspond to a reduction in the width of the scribe lane S/L in the second direction (y direction). In other words, a width value obtained by subtracting a fourth width W4 of the reduced scribe lane S/L from a fourth width W4' of the existing or conventional scribe lane S/L may correspond to a fifth width (refer to the fifth width W5 of FIG. 7B) of the first process pattern 130b-1.

If it is assumed that the size of an existing or conventional semiconductor chip and the size of a scribe lane S/L thereof are the same as described with reference to FIG. 5 and a fourth width W4 of a reduced scribe lane S/L is 80 µm, the fifth width (refer to the fifth width W5 of FIG. 7B) of the first process pattern 130b-1 formed in the first semiconductor chip 100b-1 may be 20 µm. Accordingly, the area of the first semiconductor chip 100b-1 may be increased by 20 µm in the second direction (y direction) and decreased by the size of the first process pattern 130b-1. In other words, the area of the first semiconductor chip 100b-1 may be increased by 600,000 µm$^2$ (20 µm*30,000 µm−20 µm*1,000 µm). The 600,000 µm$^2$ increase may correspond to an increase of about 2% of the area of the existing or conventional semiconductor chip.

On calculating the number or density of semiconductor chips 100b that may be disposed in a wafer, several semiconductor chips 100b may be further disposed in the wafer, as described with reference to FIG. 5. Since the number or density of semiconductor chips 100b that may be disposed in a wafer is calculated on the assumption that the size of the semiconductor chip 100b is not changed and only the width of the scribe lane S/L is reduced, a calculation result for the semiconductor chip 100b of FIG. 7A may be substantially the same as that for the semiconductor chip 100 of FIG. 3.

Referring to FIG. 9B, two semiconductor chips, i.e., first and second semiconductor chips 100d-1 and 100d-2, may be disposed with a scribe lane S/L therebetween. In FIG. 9B, a dashed line may indicate a boundary between an existing or conventional scribe lane S/L and the semiconductor chips 100d-1 and 100d-2, and a solid line may indicate a boundary between a reduced scribe lane S/L, of which a width has been reduced, and the first and second semiconductor chips 100d-1 and 100d-2.

As described above, each of the entire process patterns, i.e., first to third entire process patterns Ak1, Ak2, and Ak3, such as an alignment key, may be shared between the scribe lane S/L and the two adjacent or neighboring semiconductor chips 100d-1 and 100d-2 adjacent to the scribe lane S/L. For example, the first entire process pattern Ak1 may be shared between the scribe lane S/L and the first and second semiconductor chips 100d-1 and 100d-2 adjacent to the scribe lane S/L. As the scribe lane S/L is removed in a sawing process after the first entire process pattern Ak1 is disposed, a first lower process pattern 130d1-1 may be formed at a first long side El1 of the first semiconductor chip 100d-1 and a second upper process pattern 130d2-2 may be formed at a second long side El2 of the second semiconductor chip 100d-2.

When considering the entire process pattern Ak3 that is formed between the first semiconductor chip 100d-1 and another semiconductor chip on the upper side of the first semiconductor chip 100d-1, it may be understood that a first upper process pattern 130d2-1 is formed at a second long side El2 of the first semiconductor chip 100d-1. In addition, when considering the entire process pattern Ak2 that is formed between the second semiconductor chip 100d-2 and another semiconductor chip on the lower side of the second semiconductor chip 100d-2, it may be understood that a second lower process pattern 130d1-2 is formed at a first long side El1 of the second semiconductor chip 100d-2. Accordingly, the width of each of the lower and upper process patterns 130d1-1 and 130d2-1 of the first semiconductor chip 100d-1 in the second direction (y direction) may correspond to a half of a reduction in the width of the scribe lane S/L in the second direction (y direction).

As described with reference to FIG. 8A, in the first and second semiconductor chips 100d-1 and 100d-2, the widths of the lower process patterns 130d1-1 and 130d1-2 in the second direction (y direction) may be different from those of the upper process patterns 130d2-1 and 130d2-2 in the second direction (y direction). For example, the width of each of the lower process patterns 130d1-1 and 130d1-2 in the second direction (y direction) may correspond to a third of a reduction in the width of the scribe lane S/L in the second direction (y direction), and the width of each of the upper process patterns 130d2-1 and 130d2-2 in the second direction (y direction) may correspond to two thirds of a reduction in the width of the scribe lane S/L in the second direction (y direction). Even when the widths of the lower process patterns 130d1-1 and 130d1-2 in the second direction (y direction) are different from those of the upper process patterns 130d2-1 and 130d2-2 in the second direction (y direction), the sum of the width of the lower process pattern 130d1-1 or 130d1-2 and the width of the upper process pattern 130d2-1 or 130d2-2 in the second direction (y direction) may be equal to a reduction in the width of the scribe lane S/L in the second direction (y direction).

An increase in the size of the semiconductor chip 100d in the second direction (y direction), the sizes of the process patterns 130d1 and 130d2 of the semiconductor chip 100d, and a reduction in the width of the scribe lane S/L of the semiconductor chip 100d are substantially the same as those of the semiconductor chip 100b of FIG. 7A. Accordingly, an increase in the size of the semiconductor chip 100d may be substantially the same as that in the size of the semiconductor chip 100b of FIG. 7A. In addition, as described with reference to FIG. 9A, an increase in the number or density of semiconductor chips 100d that may be placed in a wafer may be substantially the same as that in the number or density of semiconductor chips 100 or 100b of FIG. 3 or FIG. 7A which may be placed in a wafer.

Figure 10:
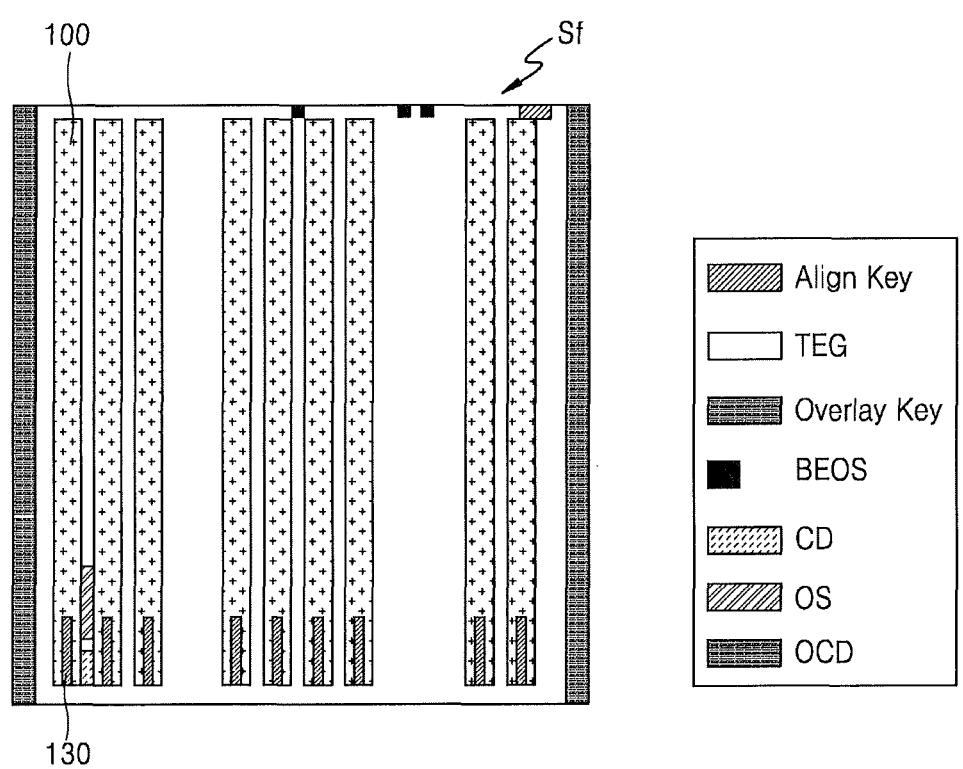
FIG. 10 is a plan view of a full-shot including semiconductor chips according to some embodiments.

FIG. 10 is a plan view of a full-shot including semiconductor chips according to some embodiments, and FIGS. 11A-F are diagrams illustrating plan views of process patterns included in the full shot of FIG. 10.

Referring to FIGS. 10 and 11A-F, a plurality of semiconductor chips 100 according to the embodiment may be disposed in one full-shot Sf, and various process patterns may be disposed in a scribe lane. In each of the semiconductor chips 100, a process pattern 130 may be disposed at a short side thereof, as described above with reference to FIGS. 3 to 5. The process pattern 130 may be, for example, an alignment key that is used in a photolithography process.

Figure 11A:
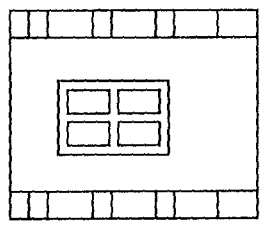
FIGS. 11A-F are diagrams illustrating plan views of process patterns included in the full shot of FIG. 10.
Figure 11B:
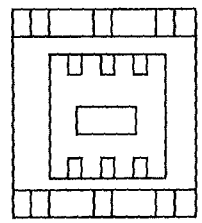
Figure 11C:
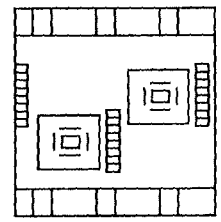
Figure 11D:
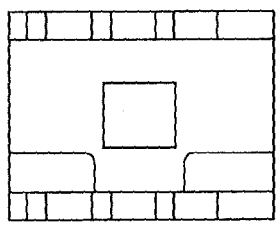
Figure 11E:
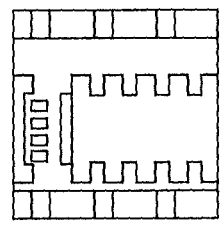
Figure 11F:
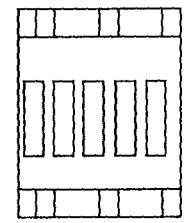

In addition to the alignment key, process patterns that are disposed in the scribe lane S/L may include another type of alignment key shown in FIG. 11A, a test element group (TEG) shown in FIG. 11B, an overlay key shown in FIG. 11C, a back end of site (BEOS) shown in FIG. 11D, an oxide side (OS) shown in FIG. 11E, and an optical critical dimension (OCD) shown in FIG. 11F. The alignment key of FIG. 11A may be an alignment key that uses different photolithography equipment than the process pattern 130, the TEG of FIG. 11B may be a pattern for testing characteristics of a semiconductor manufacturing process and characteristics of a completed semiconductor device, and the overlay key of FIG. 11C may be a pattern for measuring an alignment state between a layer formed in a previous process and a layer formed in the current process. In addition, the BEOS of FIG. 11D may be a pattern for measuring the thickness of the top layer after a chemical mechanical polishing (CMP) process, the OS of FIG. 11E may be a pattern for measuring the thickness of the outermost layer, and in some cases, the BEOS may be substituted for the OS. The OCD of FIG. 11F may be a pattern for measuring a CD or the thickness of an internal layer by using an optical method. Although not shown in drawings, a CD key having a more complex form may be disposed in the scribe lane S/L and thus be used in CD measurement.

The process patterns that are disposed in the scribe lane S/L are not limited to those disclosed above. For example, as semiconductor devices are highly integrated and semiconductor processes are diversified, various process patterns may be disposed in the scribe lane S/L. In addition, a form of each of the process patterns of FIGS. 11A-F is only an example. Accordingly, the process patterns of FIGS. 11A-F may have forms that are different from those shown in FIGS. 11A-F.

As an example, only the process pattern 130 corresponding to an alignment key is formed in the semiconductor chip 100 of FIG. 10. However, the process pattern 130 that is formed in the semiconductor chip 100 is not limited to an alignment key. For example, other process patterns, which have larger sizes and thus may be a limitation to a reduction in the width of the scribe lane S/L, may also be formed in the semiconductor chip 100. When the other process patterns are formed in the semiconductor chip 100, the other process patterns are not limited to a disposition structure in the semiconductor chip 100 of FIG. 3 and may be disposed based on a disposition structure illustrated in any of the semiconductor chips 100a to 100e of FIGS. 6 to 8B.

In addition, the sizes of the process patterns of FIGS. 11B-F, except for the process pattern (alignment key) of FIG. 11A, may be arbitrarily adjustable by a user. Accordingly, reducing the sizes of the process patterns of FIGS. 11B-F according to a reduction in the width of the scribe lane S/L may be adopted rather than disposing the process patterns of FIGS. 11B-F in the semiconductor chip 100.

Figure 12A:
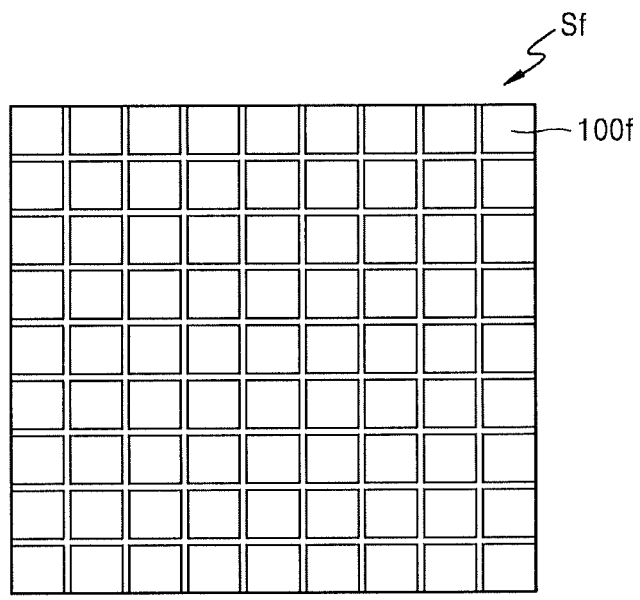
FIG. 12A is a plan view of a full-shot including semiconductor chips according to some embodiments.
Figure 12B:
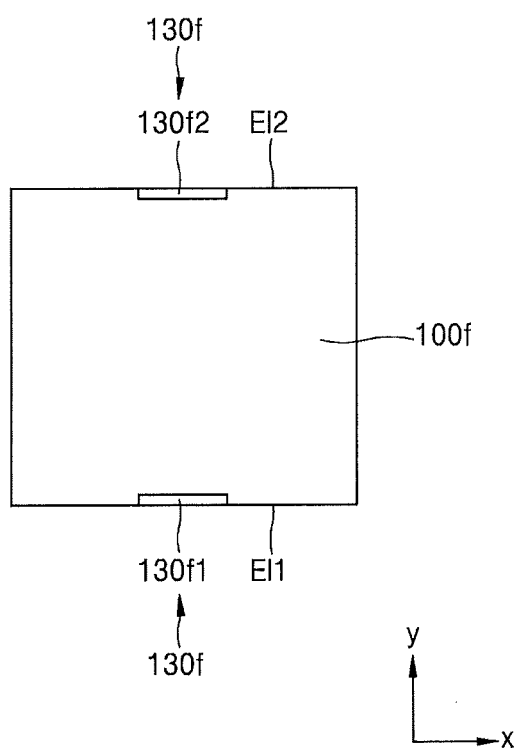
FIG. 12B is a plan view showing the magnification of one semiconductor chip.
Figure 12C:
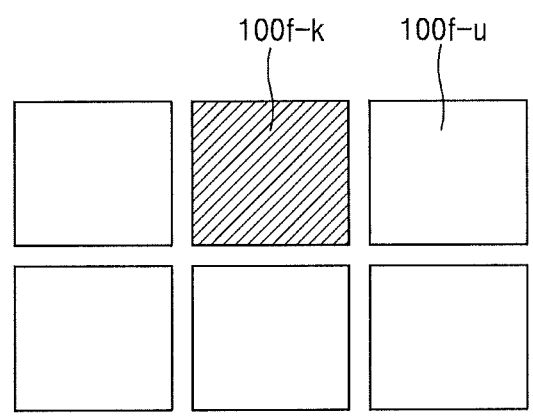
FIG. 12C is a plan view showing semiconductor chips before being separated from a wafer.

FIG. 12A is a plan view of a full-shot including semiconductor chips according to some embodiments, FIG. 12B is a plan view showing the magnification of one semiconductor chip, and FIG. 12C is a plan view showing semiconductor chips before being separated from a wafer.

Referring to FIG. 12A to 12C, a plurality of semiconductor chips 100f may be included in one full-shot. The semiconductor chips 100f according to the present embodiment may have a general rectangular shape that is close to a square, unlike the embodiments described above. Each of the semiconductor chips 100f may not be a DDI but a general memory chip or may be a non-memory chip other than a DDI. As shown in FIG. 12A, in the case of the semiconductor chip 100f having a general rectangular shape, several semiconductor chips 100f may be included in the first direction (x direction) in one full-shot, unlike a DDI, and thus, the number or density of semiconductor chips 100f that may be included in one full-shot may be increased by several times, compared to the DDI.

Since if it is assumed that the size of the full-shot is relatively constant, more semiconductor chips 100f may be included in one full-shot, the size of the semiconductor chip 100f may be smaller than that of the semiconductor chip 100 of FIG. 3. The size of the full-shot that is applied to the semiconductor chip 100f may also be different from that of the full-shot that is applied to the semiconductor chip 100 of FIG. 3.

As shown in FIG. 12B, the semiconductor chip 100f may include a process pattern 130f. In the semiconductor chip 100f, a lower process pattern 130f1 and an upper process pattern 130f2 may be disposed at a first long side El1 and a second long side El2, respectively, similar to the semiconductor chip 100d of FIG. 8A. However, the inventive concepts are not limited thereto. For example, only one process pattern may be disposed at any of the first and second long sides El1 and El2, like the semiconductor chip 100 of FIG. 3 or the semiconductor chip 100b of FIG. 7A. However, a disposition structure of a process pattern may be appropriately selected within a range that does not influence a function of the semiconductor chip 100f, considering that the size of the semiconductor chip 100f is relatively small.

As shown in FIG. 12C, process patterns may be formed to be included only in a semiconductor chip 100-k for process monitoring, and any process pattern may not be formed in a general semiconductor chip 100-u. For example, all process patterns that are a limitation to a reduction in the width of a scribe lane S/L may be intensively formed in the semiconductor chip 100-k for process monitoring. The semiconductor chip 100-k for process monitoring may be scrapped when semiconductor chips are individualized through a sawing process after semiconductor processes are completed.

Even if all process patterns are formed in the semiconductor chip 100-k for process monitoring and the semiconductor chip 100-k for process monitoring is scrapped when semiconductor chips are individualized, it may not matter since the size of the semiconductor chip 100-k for process monitoring is relatively small. On the other hand, since the size of the semiconductor chip 100 of FIG. 3 is relatively large, forming all process patterns in one semiconductor chip 100 of FIG. 3 may be disadvantageous in terms of productivity. In some cases, two semiconductor chips 100-k for process monitoring may be used.

Figure 13A:
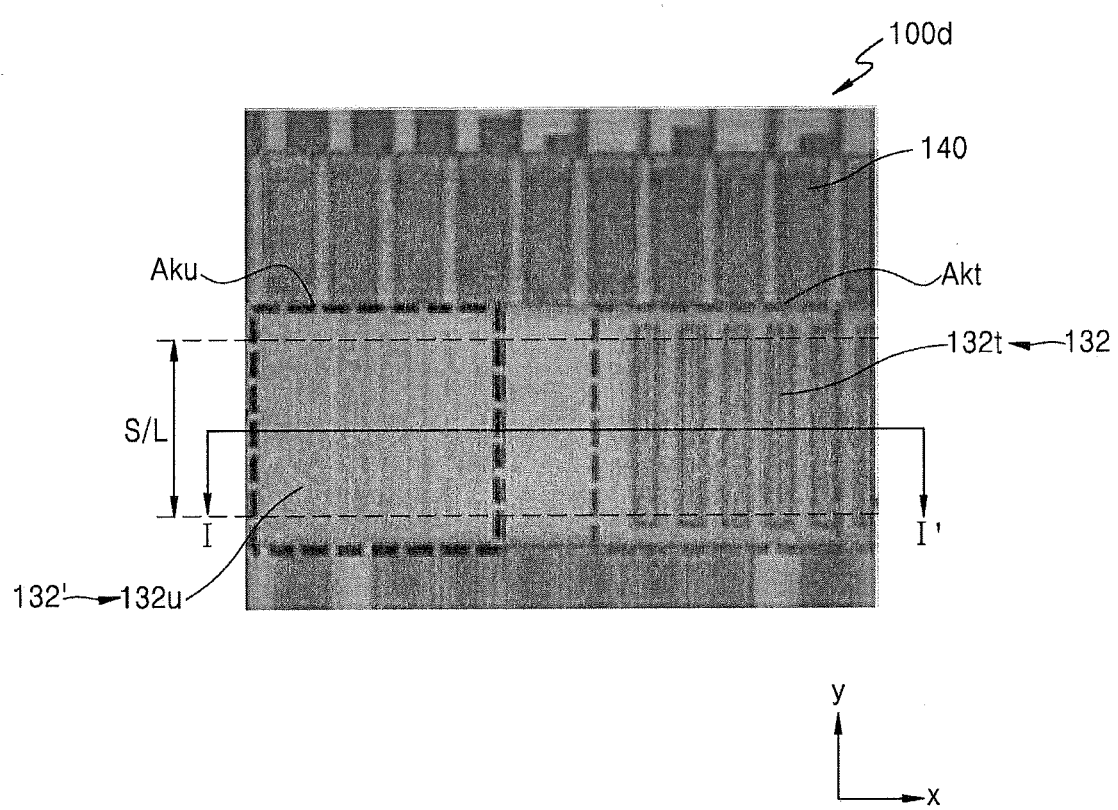
FIG. 13A is a plan view of a process pattern included in a semiconductor chip according to some embodiments.
Figure 13B:
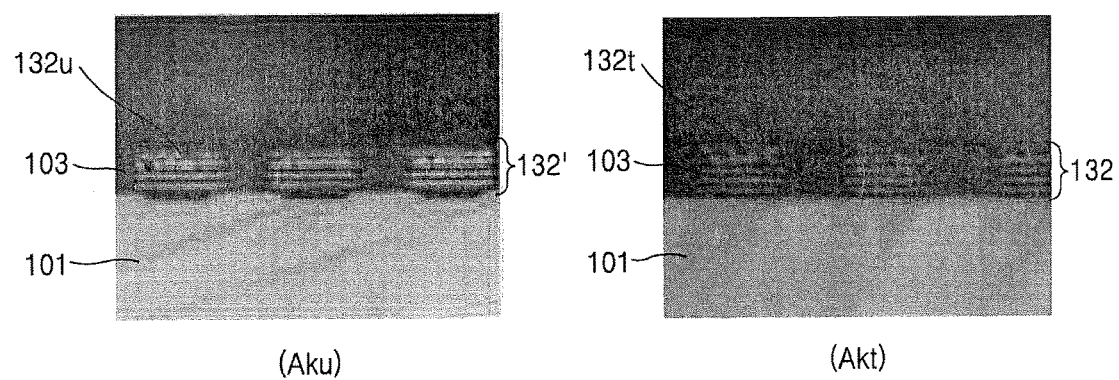
FIGS. 13B and 13C are cross-sectional views of the process pattern of FIG. 13A.
Figure 13C:
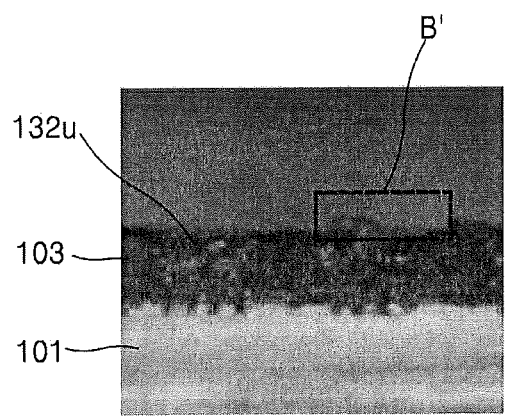
Figure 13C:
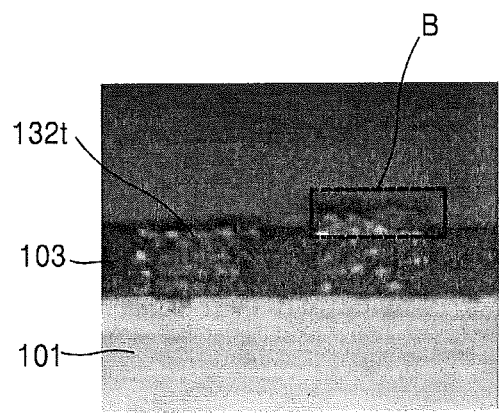

FIG. 13A is a plan view of a process pattern included in a semiconductor chip 100d according to some embodiments, and FIGS. 13B and 13C are cross-sectional views of the process pattern. FIG. 13B is a cross-sectional view taken along a line I-I', and FIG. 13C is a cross-sectional view after a sawing process has been performed.

Referring to FIGS. 13A to 13C, the semiconductor chip 100d may include a portion of the entire process pattern as the process pattern. FIG. 13A shows a scribe lane S/L before the semiconductor chip 100d is separated from a wafer, and a portion of the semiconductor chip 100d adjacent to the scribe lane S/L. The entire process pattern may be, for example, an alignment key, and may include a plurality of metal layers 132 arranged at regular intervals, as shown in FIG. 4. Each of the metal layers 132 may include at least two layers, and the number of layers in the metal layers 132 may be changed according to the number of layers for which alignment may be required. For example, when an alignment key is used for forming wiring metal layers M1 to M4, the number of layers of the metal layers 132 may be four. In FIG. 13A, a reference numeral '140' may denote a connection terminal formed on an electrode pad (e.g., the electrode pad of FIG. 3) of the semiconductor chip 100d, and the connection terminal may include a bump.

Metal layers 132 in a first entire process pattern Akt indicated by a right-sided dashed line rectangle may include the top metal layer 132t as an uppermost layer, and metal layers 132' in a second entire process pattern Aku indicated by a left-sided dashed line rectangle may include a lower metal layer 132u as an uppermost layer without including the top metal layer 132t. Referring to FIG. 13B, it may be confirmed that the metal layers 132 in the first entire process pattern Akt include the top metal layer 132t as an uppermost layer, and the metal layers 132' in the second entire process pattern Aku include the lower metal layer 132u as an uppermost layer. That is, for the second entire process pattern Aku, the top metal layer 132t may be omitted, such that the number of metal layers 132' thereof may be one less than the number of metal layers M1 to M4 of the semiconductor chip. In FIGS. 13B and 13C, a reference numeral '101' may denote a silicon substrate and a reference numeral '103' may denote an interlayer insulating film.

FIG. 13C shows a state in which a burr has occurred in a cut portion of the metal layers 132 after a sawing process. Referring to FIG. 13C, it may be confirmed that a relatively high burr B has occurred in the first entire process pattern Akt and a relatively low burr B' has occurred in the second entire process pattern Aku. In other words, in the first entire process pattern Akt, a burr, which is a phenomenon in which a metal layer lifts off after a sawing process, may be relatively high (an undesired state) after a sawing process, due to the top metal layer 132t. On the other hand, in the second entire process pattern Aku, a burr may be relatively low (a desired state) after a sawing process since the top metal layer 132t does not exist.

In the semiconductor chips 100 and 100a to 100f according to the embodiments, an electrode pad (refer to the electrode pad 120 of FIG. 3) that is formed in a top area may be formed without an alignment key. Accordingly, the top metal layer 132t of the process patterns 130 and 130a to 130f in the semiconductor chips 100 to 100f may be omitted. As the top metal layer 132t is omitted, the generation of a burr in the process patterns 130 and 130a to 130f may be reduced or minimized. Depending on the type of semiconductor chip, an electrode pad may be formed by using an alignment key. In such a case, the top metal layer 132t of the process patterns 130 and 130a to 130f may not be omitted. Accordingly, a method, in which the top metal layer 132t of the process patterns 130 and 130a to 130f is formed to be smaller than the lower metal layer 132u to reduce or minimize a contact with a blade in a sawing process and thus minimize the generation of a burr, may be adopted.

In a subsequent process, that is, a mounting process for the semiconductor chip 100, the burr may cause a short circuit with respect to a wiring pattern (for example, a wiring pattern 210 or 220 of FIG. 15A) of a tape wiring substrate (for example, a tape wiring substrate 200 of FIG. 15A) when the height of a gold bump is low. Accordingly, the burr may cause reliability problem(s) in the mounting process of the semiconductor chip 100 and may be a limitation to lowering the width of the gold bump to a certain level or less.

Figure 14:
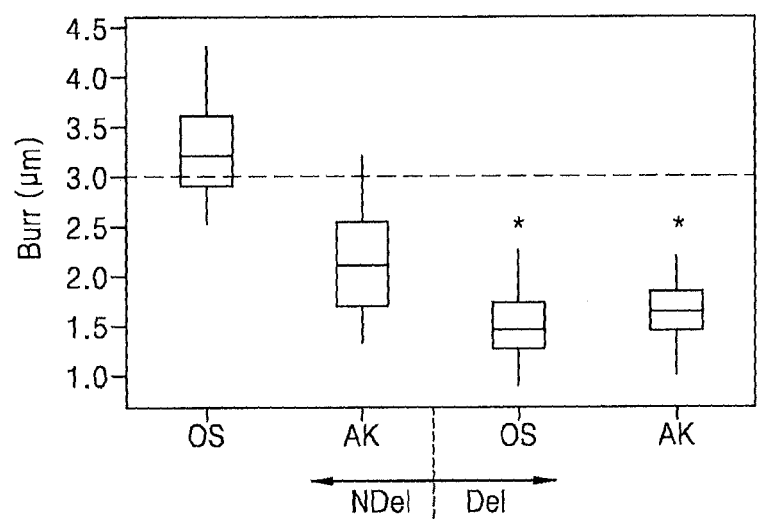
FIG. 14 is a graph showing an effect by the omission of the top metal layer of a process pattern in a semiconductor chip according to some embodiments.

FIG. 14 is a graph showing an effect by the omission of the top metal layer of a process pattern in a semiconductor chip according to some embodiments. The graph of FIG. 14 shows data obtained by measuring burrs with respect to 30 OS patterns and 30 alignment keys (AKs). The x axis of the graph denotes a case NDel, in which the top metal layer is not omitted from the OS patterns and the AKs, and a case Del in which the top metal layer is omitted from the OS patterns and the AKs, and the y axis of the graph denotes the height of a burr occurring in each of the OS patterns and the AKs. The unit of the height is µm.

Referring to FIG. 14, the heights of burrs occurring in the OS patterns in the case NDel have about 3 µm or more that is relatively high, whereas the heights of burrs occurring in the OS patterns in the case Del have about 1.5 µm that is relatively low. In addition, the distribution of burrs is relatively wide in the case NDel, but is relatively narrow in the case Del.

The heights of burrs occurring in the AKs in the case NDel are about 2 µm, whereas the heights of burrs occurring in the AKs in the case Del are about 1.6 µm, which is relatively low. In addition, similar to the OS patterns, the distribution of burrs is relatively wide in the case NDel, but is relatively narrow in the case Del.

As shown in the graph of FIG. 14, an effect by the omission of the top metal layer of a process pattern is greater in the OS patterns than in the AKs. One reason is because the AKs include a combination of a plurality of fine metal layers, as shown in FIG. 4, whereas the OS patterns have a large one body form, as shown in FIG. 11E. Accordingly, in the OS patterns, a contact area with a blade in a sawing process may be relatively large and the occurrence of burrs may be serious, and thus, due to the structural characteristics of the OS patterns, an effect by the omission of the top metal layer may increase.

In the graph of FIG. 14, which is a boxplot graph, a central line of a quadrangle box denotes an average and the height of the quadrangle box denotes the distribution of burrs.

Consequently, through the graph of FIG. 14, it may be understood that the distribution and the heights of burrs occurring in the OS patterns and the AKs may be lowered by omitting the top metal layer. Accordingly, also in the process patterns 130 and 130a to 130f of the semiconductor chips 100 and 100a to 100f according to the embodiments, the distribution and the heights of burrs may be lowered by omitting the top metal layer 132t. However, as described above, when the top metal layer may not be omitted, the top metal layer 132t may be formed to be smaller than the lower metal layer 132u to minimize the generation of a burr.

The method, in which the generation distribution of burrs and the heights of the burrs are lowered by omitting the top metal layer, may be applied to some or all process patterns as well as the OS patterns and the AKs. For example, also in process patterns that are disposed in a scribe lane or in both a semiconductor chip and a scribe lane and include metal layers to be cut by a sawing process, the generation distribution of burrs and the heights of the burrs may be lowered by omitting the top metal layer. In addition, when the top metal layer may not be omitted, the top metal layer may be formed to be smaller than a lower metal layer to minimize the generation of a burr.

Figure 15A:
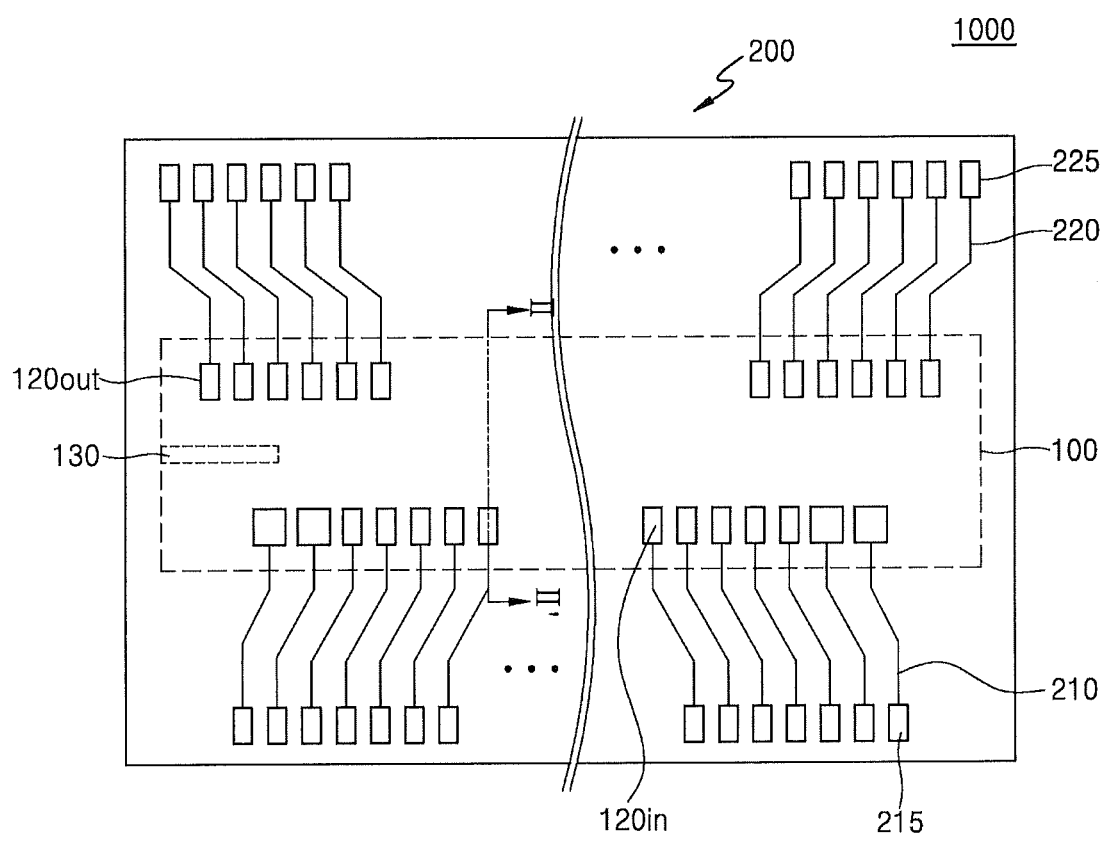
FIG. 15A is a plan view of a semiconductor package including a semiconductor chip according to some embodiments.
Figure 15B:
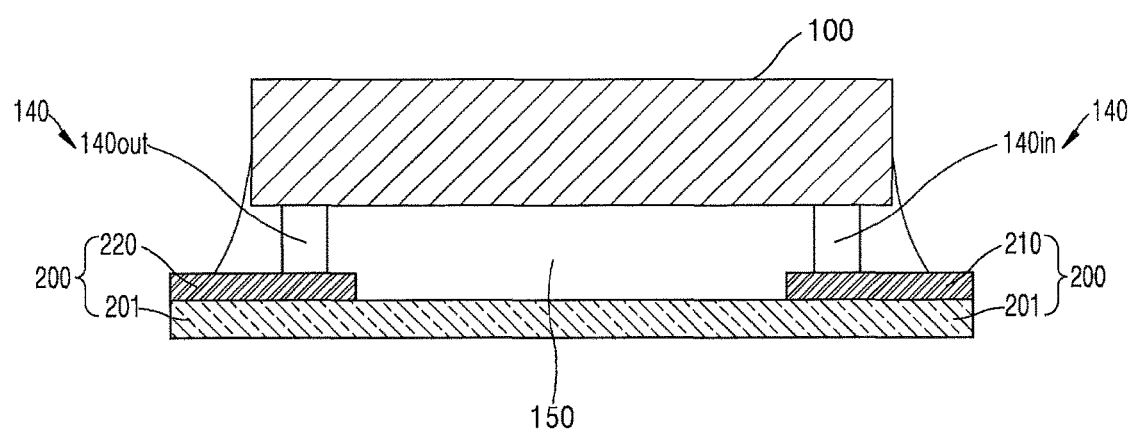
FIG. 15B is a cross-sectional view of the semiconductor package of FIG. 15A.

FIG. 15A is a plan view of a semiconductor package 1000 including a semiconductor chip 100 according to some embodiments, and FIG. 15B is a cross-sectional view of the semiconductor package 1000. FIG. 15B is a cross-sectional view taken along a line II-II' of FIG. 15A. Descriptions provided above with reference to FIGS. 1 to 14 will be briefly provided or omitted.

Referring to FIGS. 15A and 15B, the semiconductor package 1000 may include the semiconductor chip 100 and a tape wiring substrate 200.

Figure 18:
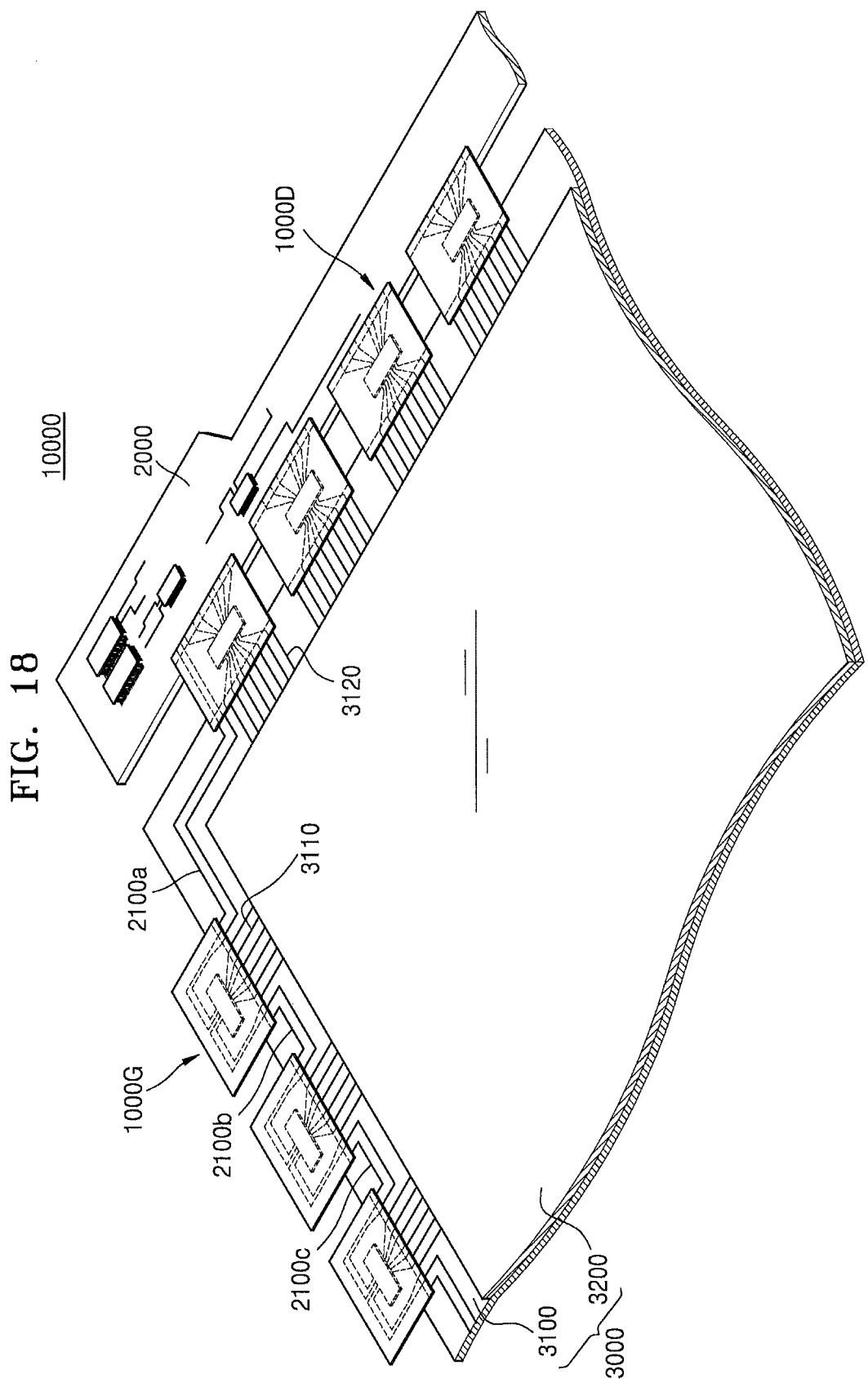
FIG. 18 is a conceptual diagram showing a portion of a display apparatus according to some embodiments.

The semiconductor chip 100 may be a source driving chip that receives a signal voltage from a PCB (refer to the PCB 2000 of FIG. 18), generates an image signal, and outputs the image signal to a data line of a display panel (refer to the display panel 3000 of FIG. 18). Also, the semiconductor chip 100 may be a gate driving chip that generates a scan signal including an on/off signal of a transistor and outputs the scan signal to a gate line of a display panel (refer to the display panel 3000 of FIG. 18). The semiconductor chip 100 is not limited to a source driving chip or a gate driving chip. For example, when the semiconductor package 1000 is combined with another electronic device other than a display apparatus, the semiconductor chip 100 may be a chip for driving the other electronic device.

The semiconductor chip 100 may be mounted on a chip mounting portion of a base film 201 by using a flip-chip bonding method. In other words, connection terminals 140 such as bumps may be disposed on input pads 120in and output pads 120out of the semiconductor chip 100, and the semiconductor chip 100 may be mounted on the tape wiring substrate 200 by physically electrically combining the connection terminals 140 with wiring patterns 210 and 220 of the tape wiring substrate 200. In order to reduce or prevent physical and/or chemical damage of a combination part, a space between the semiconductor chip 100 and the tape wiring substrate 200 may be filled with an underfill 150.

The semiconductor chip 100 may include a process pattern 130 as described above. In the semiconductor package 1000, the semiconductor chip 100 mounted on the tape wiring substrate 200 may be the semiconductor chip 100 of FIG. 3. However, the semiconductor chip 100 that is mounted on the tape wiring substrate 200 is not limited to the semiconductor chip 100 of FIG. 3. For example, any of the semiconductor chips 100a to 100e of FIGS. 6, 7A, 7C, 8A, and 8B may be mounted on the tape wiring substrate 200 as the semiconductor chip 100.

Some of the input and output electrode pads 120in and 120out and some of the wiring patterns 210 and 220 are illustrated in FIG. 15A for convenience of understanding. The input and output electrode pads 120in and 120out are disposed on the bottom surface of the semiconductor chip 100 and some of the wiring patterns 210 and 220 are disposed or extend on the chip mounting portion of the base film 201, and thus, the input and output electrode pads 120in and 120out and some of the wiring patterns 210 and 220 may be covered by the semiconductor chip 100 and thus may not be shown.

The tape wiring substrate 200 may include an insulating base film, i.e., the base film 201, and a plurality of conductive wiring patterns, i.e., the wiring patterns 210 and 220.

The base film 201 may be a flexible film including polyimide that is a material whose coefficient of thermal expansion (CTE) and durability are excellent. However, the material of the base film 201 is not limited to a polyimide. For example, the base film 201 may include a synthetic resin, such as epoxy-based resin or acrylic, polyether nitrile, polyether sulfone, polyethylene terephthalate, or polyethylene naphthalate.

The base film 201 may include the chip mounting portion (a dashed line part corresponding to the semiconductor chip 100) on which the semiconductor chip 100 is mounted, and a wiring portion on which the wiring patterns 210 and 220 are disposed outside the chip mounting portion. Although not shown in FIG. 15A, the base film 201 may include a panel attachment portion, which is on the lower side of the base film 201 and to which a display panel (refer to the display panel 3000 of FIG. 18) is attached, and a PCB attachment portion, which is on the upper side and to which a PCB (refer to the PCB 2000 of FIG. 18) is attached.

The wiring patterns 210 and 220 may be formed on the base film 201 and include a conductive metal material. For example, the wiring patterns 210 and 220 may include copper (Cu). However, the material of the wiring patterns 210 and 220 is not limited to Cu. The wiring patterns 210 and 220 may be covered with a protective film, such as solder resist.

The wiring patterns 210 and 220 may include input wiring patterns 210 and output wiring patterns 220. Although not shown in FIG. 15A, the wiring patterns 210 and 220 may include bypass wiring patterns that do not pass through the semiconductor chip 100. The input wiring patterns 210 may transmit signal voltages transmitted from the PCB to the semiconductor chip 100. One end of each input wiring pattern 210 may be connected to an input electrode pad 120in corresponding to the input wiring pattern 210, and the other end of each input wiring pattern 210 may be connected to an input wiring electrode 215 corresponding to the input wiring pattern 210.

The output wiring patterns 220 may transmit an image signal from the semiconductor chip 100 to a data line of a display panel. One end of each output wiring pattern 220 may be connected to an output electrode pad 120out corresponding to the output wiring pattern 220, and the other end of each output wiring pattern 220 may be connected to an output wiring electrode 225 corresponding to the output wiring pattern 220.

Figure 16A:
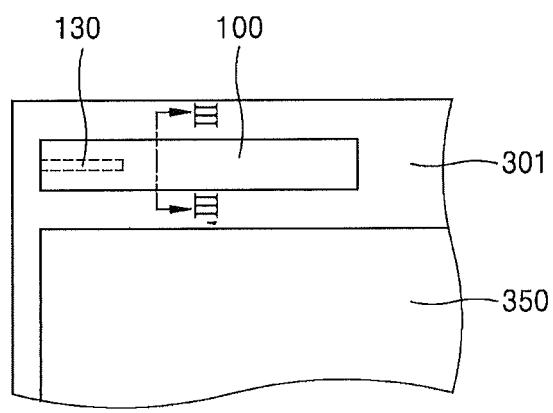
FIG. 16A is a plan view of a semiconductor package including a semiconductor chip according to some embodiments.
Figure 16B:
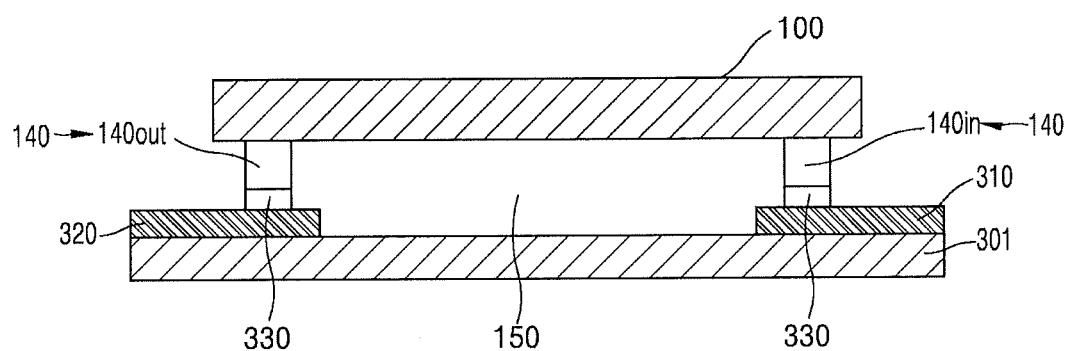
FIG. 16B is a cross-sectional view of the semiconductor package of FIG. 16A.

FIG. 16A is a plan view of a semiconductor package 1000a including a semiconductor chip 100 according to some embodiments, and FIG. 16B is a cross-sectional view of the semiconductor package 1000a. FIG. 16B is a cross-sectional view taken along a line III-III' of FIG. 16A. Descriptions provided above with reference to FIGS. 1 to 15B will be briefly provided or omitted.

Referring to FIGS. 16A and 16B, the semiconductor package 1000a may include the semiconductor chip 100 and a glass substrate 301. The semiconductor chip 100 may correspond to the semiconductor chip 100 of FIG. 3, and thus, the semiconductor chip 100 may include a process pattern 130. However, the semiconductor chip 100 that is mounted on the glass substrate 301 is not limited to the semiconductor chip 100 of FIG. 3. For example, any of the semiconductor chips 100a to 100e of FIGS. 6, 7A, 7C, 8A, and 8B may be mounted on the glass substrate 301 as the semiconductor chip 100.

The semiconductor package 1000a may be implemented by using a mounting method similar to that of the semiconductor package 1000 of FIG. 15A. While the semiconductor package 1000 of FIG. 15A uses the tape wiring substrate 200 as a mounting substrate, the semiconductor package 1000a may use the glass substrate 301 as a mounting substrate. In addition, while the wiring patterns 210 and 220 including Cu are formed in the tape wiring substrate 200, wiring patterns 310 and 320 including transparent indium tin oxide (ITO) may be formed in the glass substrate 301.

In the semiconductor package 1000 of FIG. 15A, the semiconductor chip 100 may be mounted on the tape wiring substrate 200 by directly combining the connection terminals 140 formed in the semiconductor chip 100 to the wiring patterns 210 and 220 through thermocompression bonding. On the other hand, in the semiconductor package 1000a, the semiconductor chip 100 may be mounted on the glass substrate 301 by using an adhesive conductive film (ACF) 330.

The structure of the semiconductor package 1000 as shown in FIG. 15A is referred to as a chip on film (COF) package structure, and the structure of the semiconductor package 1000a is referred to as a chip on glass (COG) package structure. In general, the COG package such as the semiconductor package 1000a may be used in a technology for mounting a DDI on the glass substrate 301 in an LCD device. In this case, as shown in FIG. 16A, a DDI may be mounted on the glass substrate 301 on which an LCD panel 350 has been disposed.

Figure 17:
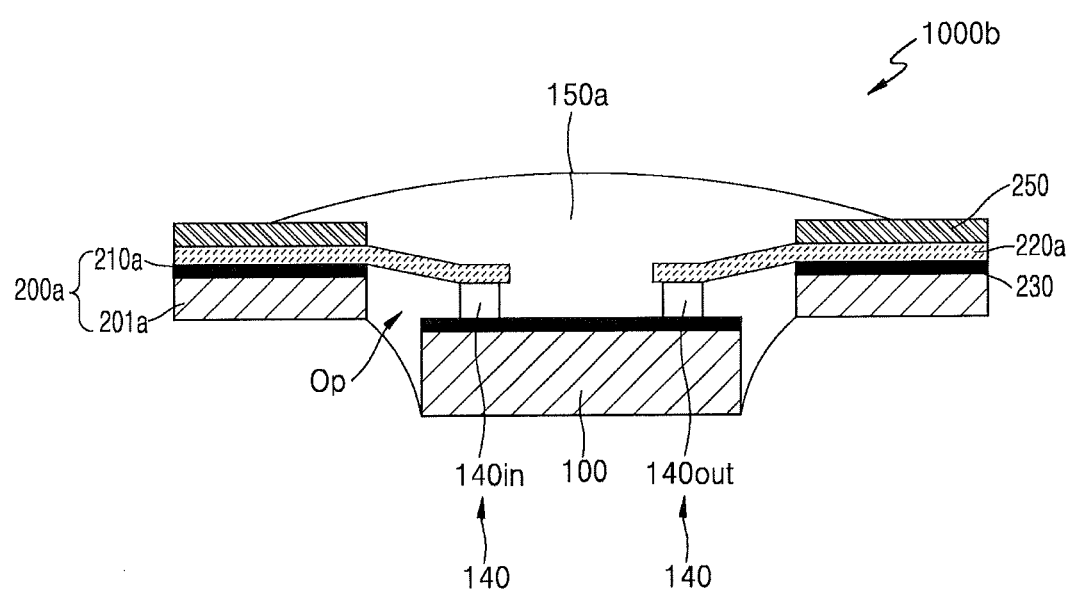
FIG. 17 is a cross-sectional view of a semiconductor package including a semiconductor chip according to some embodiments.

FIG. 17 is a cross-sectional view of a semiconductor package 1000b including a semiconductor chip 100 according to some embodiments. Descriptions provided above with reference to FIGS. 1 to 16B will be briefly provided or omitted.

Referring to FIG. 17, the semiconductor package 1000b may include the semiconductor chip 100 and a tape carrier 200a. The semiconductor chip 100 may correspond to the semiconductor chip 100 of FIG. 3, and thus, the semiconductor chip 100 may include a process pattern 130. However, the semiconductor chip 100 that is mounted on the tape carrier 200a is not limited to the semiconductor chip 100 of FIG. 3. For example, any of the semiconductor chips 100a to 100e of FIGS. 6, 7A, 7C, 8A, and 8B may be mounted on the tape carrier 200a as the semiconductor chip 100.

The semiconductor package 1000b is similar to the semiconductor package 1000 of FIG. 15A. However, the semiconductor package 1000b may be different from the semiconductor package 1000 in that the semiconductor package 1000b uses the tape carrier 200a instead of the tape wiring substrate 200. The thickness of a base film 201a of the tape carrier 200a may be larger than that of the base film 201 that is used in the tape wiring substrate 200, and as shown in FIG. 17, an opening Op may be formed in a part in which the semiconductor chip 100 is mounted. In addition, a plurality of slit holes may be formed in the base film 201a to facilitate the bending of the base film 201a.

Wiring patterns 210a and 220a are formed on the base film 201a of the tape carrier 200a, and the wiring patterns 210a and 220a may be joined to the base film 201a through an adhesive 230. The wiring patterns 210a and 220a may be disposed to have a structure protruding relative to the opening Op of the base film 201a. The semiconductor chip 100 may be mounted by using a flip-chip bonding method through a connection terminal 140 and thus be electrically connected to the wiring patterns 210a and 220a. As shown in FIG. 17, as the semiconductor chip 100 is mounted to be accommodated in the opening Op, the semiconductor chip 100 may be mounted on the bottom surfaces of the wiring patterns 210a and 220a. However, the semiconductor chip 100 may be mounted on the top surfaces of the wiring patterns 210a and 220a. The structure of the semiconductor package 1000b is referred to as a tape carrier package (TCP) to differentiate from the structure of the semiconductor packages 1000 of FIG. 15A and the structure of the semiconductor package 1000a of FIG. 16A. In FIG. 17, a reference numeral '150a' may denote an underfill and a reference numeral '250' may denote a solder resist.

FIG. 18 is a conceptual diagram showing a portion of a display apparatus 10000 according to some embodiments. Descriptions provided above with reference to FIGS. 1 to 17B will be briefly provided or omitted.

Referring to FIG. 18, the display apparatus 10000 may include a display panel 3000, a gate chip package 1000G, a data chip package 1000D, and a PCB 2000.

The display panel 3000 may include a lower substrate 3100 and an upper substrate 3200. The lower substrate 3100 may include gate wires 3110, data wires 3120, a thin film transistor, a pixel electrode, and the like. The upper substrate 3200 may have a size smaller than that of the lower substrate 3100 and be stacked on the lower substrate 3100 so as to face the lower substrate 3100, and may include a black matrix, a color filter, a common electrode, and the like. A liquid crystal layer (not shown) may be interposed between the upper substrate 3200 and the lower substrate 3100.

The gate chip package 1000G may be connected to the gate wires 3110 formed in the lower substrate 3100, and the data chip package 1000D may be connected to the data wires 3120 formed in the lower substrate 3100.

A plurality of driving components are mounted on the PCB 2000. The driving components are semiconductor chips designed by a one-chip technique, and thus may provide a gate driving signal and a data driving signal at once to the gate chip package 1000G and the data chip package 1000D, respectively.

In an effective display area in which actual images are displayed, the gate wires 3110 are disposed at regular intervals. However, in a non-effective display area corresponding to an edge of the lower substrate 3100, the gate wires 3110 may be disposed at narrow intervals to form a series of groups in order to facilitate a connection with the gate chip package 1000G. Similarly, in the effective display area in which actual images are displayed, the data wires 3120 are disposed at regular intervals. However, in the non-effective display area corresponding to the edge of the lower substrate 3100, the data wires 3120 may be disposed at narrow intervals in order to facilitate a connection with the data chip package 1000D.

The gate chip package 1000G may transmit a gate driving signal, which is output from the PCB 2000, to the thin film transistor of the lower substrate 3100. The gate chip package 1000G may include at least one of the semiconductor chips 100 and 100a to 100e described with reference to FIGS. 3, 6, 7A, 7C, 8A, and 8B as a gate driving chip. For example, the gate chip package 1000G may have the structure of the semiconductor package 1000 shown in FIG. 15A or the structure of the semiconductor package 1000b shown in FIG. 17.

The data chip package 1000D may be divided into a first data chip package, which provides both a gate driving signal and a data driving signal, and a second data chip package that provides a data driving signal. Each of the first and second data chip packages may include at least one of the semiconductor chips 100 and 100a to 100e described with reference to FIGS. 3, 6, 7A, 7C, 8A, and 8B as a data driving chip. For example, the first data chip package and the second data chip package may have the structure of the semiconductor package 1000 shown in FIG. 15A or the structure of the semiconductor package 1000b shown in FIG. 17.

The first data chip package may include wiring patterns formed on a base film and a data driving chip electrically connected to the wiring patterns. Some of the wiring patterns may be connected to a first gate driving signal transmission line 2100a of the lower substrate 3100 without being connected to the data driving chip, and thus may transmit a gate driving signal output from the PCB 2000 to the gate chip package 1000G. The rest of the wiring patterns may be connected to the data wires 3120 of the lower substrate 3100 while being connected to the data driving chip, and thus may transmit a data driving signal output from the PCB 2000 to the thin film transistor of the lower substrate 3100.

Similar to the first data chip package, the second data chip package that is adjacent to the first data chip package may include wiring patterns formed on a base film and a data driving chip electrically connected to the wiring patterns. The second data chip package may transmit a data driving signal, which is output from the PCB 2000, to the thin film transistor of the lower substrate 3100.

The first gate driving signal transmission line 2100*a* may be disposed at an edge part of the lower substrate 3100 between the gate chip package 1000G and the first data chip package which are closest to each other. One end of the first gate driving signal transmission line 2100*a* may extend toward the data wires 3120, and the other end of the first gate driving signal transmission line 2100*a* may extend toward the gate wires 3110. Other gate driving signal transmission lines, for example, second and third gate driving signal transmission lines 2100*b* and 2100*c*, separated from the first gate driving signal transmission line 2100*a* may be further disposed between groups of gate wires 3110.

In the display apparatus 10000, a signal supply from the PCB 2000 to the display panel 3000 may be performed by using the following method.

When an image signal output from an external information processing apparatus, for example, a computer, is input to the PCB 2000, the PCB 2000 generates a gate driving signal and a data driving signal which correspond to the input image signal. The data driving signal generated from the PCB 2000 is input to a data driving chip via wiring patterns of the data chip package 1000D, and the data driving signal input to the data driving chip is processed in the data driving chip. Thereafter, processed data driving signal may be input to the data wires 3120 of the lower substrate 3100 via wiring patterns of the first and second data chip packages.

At the same time, the gate driving signal generated from the PCB 2000 may be input to the first gate driving signal transmission line 2100*a* of the lower substrate 3100 via some of wiring patterns of the first data chip package. The gate driving signal input along the first gate driving signal transmission line 2100*a* may be input to a gate driving chip via wiring patterns of the gate chip package 1000G, and the gate driving signal input to the gate driving chip may be processed in the gate driving chip. Thereafter, processed gate driving signal may be input to the gate wires 3110 of the lower substrate 3100 via wiring patterns of the gate chip package 1000*g*.

In addition, some of gate driving signals input along the first gate driving signal transmission line 2100*a* may be transmitted to a neighboring gate chip package 1000G via a second gate driving signal transmission line without being processed by the gate driving chip. Through the above-described process, when a gate output signal is applied to the gate wires 3110 of the lower substrate 3100, all thin film transistors of one row may be turned on in response to the gate output signal, and thus, a voltage applied to the data driving chip may be quickly output to a pixel electrode depending on the turn-on of the thin film transistors. As a result, an electric field may be formed between the pixel electrode and a common electrode. The arrangement of a liquid crystal interposed between the upper substrate 3200 and the lower substrate 3100 may be changed due to the formation of the electric field, and thus, predetermined image information may be externally displayed. A connection structure between pixel cells and signal lines is shown in more detail in FIG. 19B.

As described above, the gate chip package 1000G and the data chip package 1000D have the structure of the semiconductor package 1000 of FIG. 15A or the structure of the semiconductor package 1000*b* of FIG. 17. However, the structure of the gate chip package 1000G and the structure of the data chip package 1000D are not limited thereto. For example, the gate chip package 1000G and the data chip package 1000D may have a COG package structure, like the semiconductor package 1000*a* of FIG. 16A.

Figure 19A:
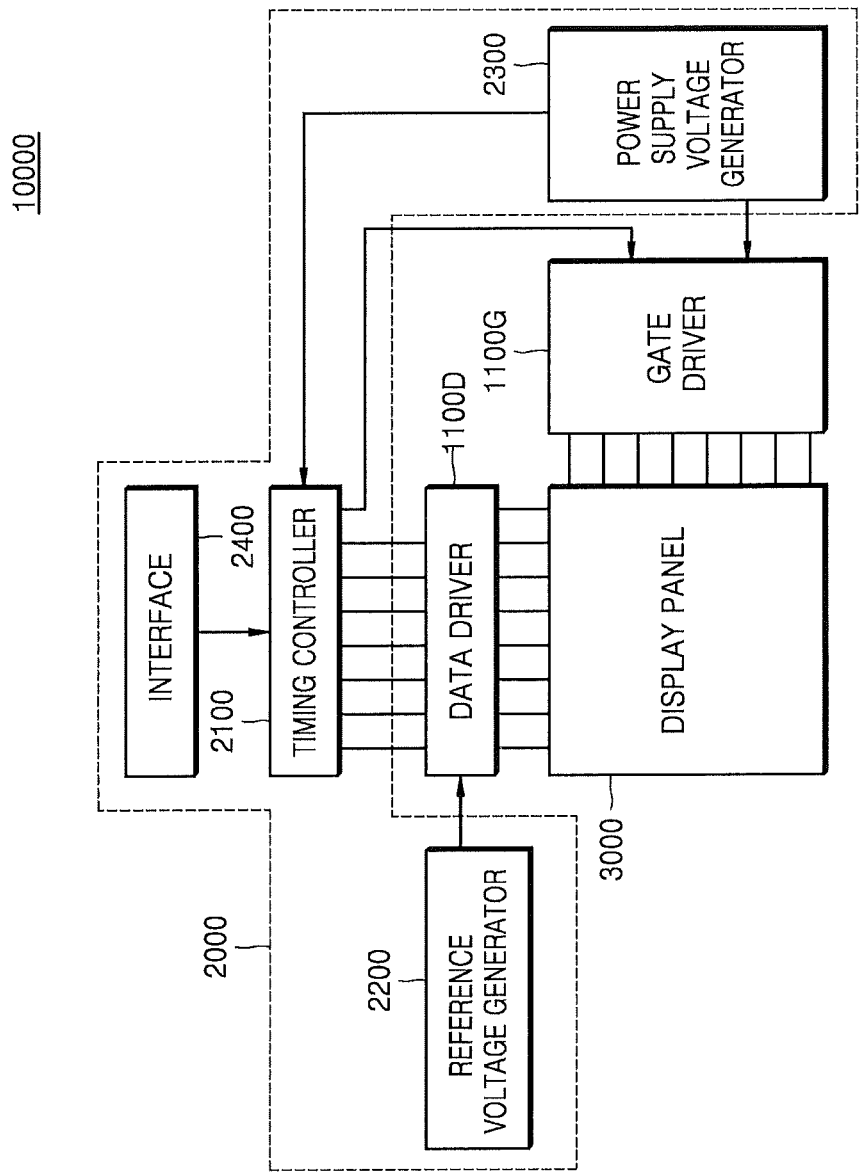
FIG. 19A is a configuration diagram of the display apparatus of FIG. 18.
Figure 19B:
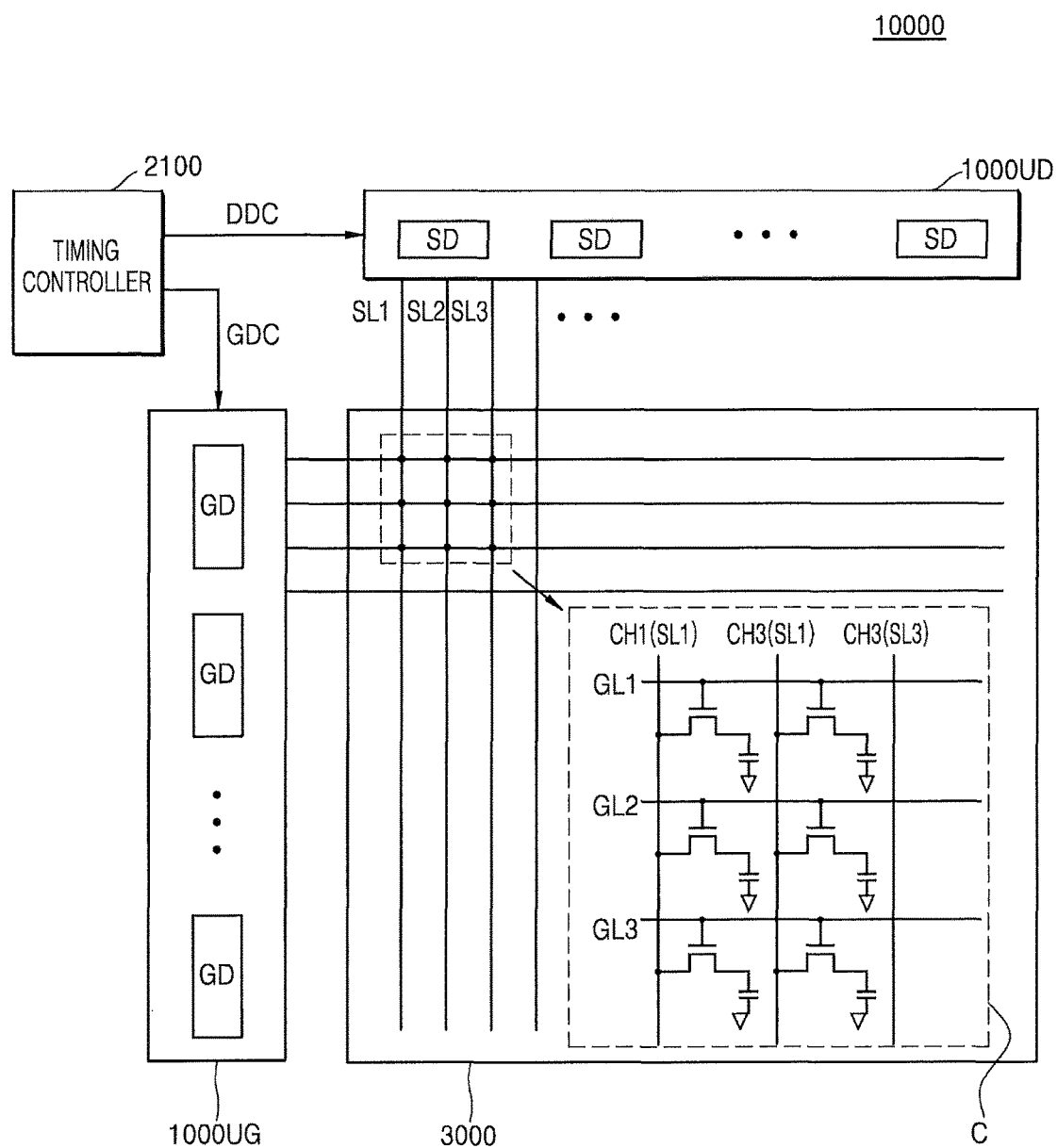
FIG. 19B is a circuit diagram of the display apparatus of FIG. 18.

FIG. 19A is a configuration diagram of the display apparatus 10000 of FIG. 18, and FIG. 19B is a circuit diagram of the display apparatus 10000 of FIG. 18. FIGS. 19A and 19B show in more detail a connection structure between pixel cells and signal lines. Descriptions provided above with reference to FIGS. 1 to 18 will be briefly provided or omitted.

Referring to FIG. 19A, the semiconductor chips 100 and 100*a* to 100*e* described above with reference to FIGS. 3, 6, 7A, 7C, 8A, and 8B may correspond to a data driver 1100D and/or a gate driver 1100G of the display apparatus 10000. The data driver 1100D may process a data signal that is output from a timing controller 2100. The gate driver 1100G may process a scan signal that is output from the timing controller 2100.

The timing controller 2100, a reference voltage generator 2200, a power supply voltage generator 2300, and an interface 2400 may be mounted on the PCB 2000. The timing controller 2100 may generate the data signal, the scan signal, and a control signal. The reference voltage generator 2200 may generate a reference voltage that is used for generating, in the data driver 1100D, a color signal or image signal corresponding to the data signal. The data signal may be temporarily stored or latched in the data driver 1100D in response to the control signal. Thereafter, the color signal or the image signal may be output to data wires of a display panel 3000 in synchronization with a scan signal that is output from the gate driver 1100G. The gate driver 1100G may sequentially output scan signals to gate wires of the display panel 3000. The power supply voltage generator 2300 may generate a power supply voltage of the timing controller 2100 and the gate driver 1200*a*. The power supply voltage and the reference voltage may be different from each other.

A tape wiring substrate (refer to the tape wiring substrate 200 of FIG. 15A) may electrically connect the PCB 2000 to the display panel 3000. As semiconductor chips corresponding to the data driver 1100D and/or the gate driver 1100G are mounted on the tape wiring substrate, the structure of the semiconductor package 1000 or 1000*b* shown in FIG. 15A or FIG. 17 may be implemented. Input wiring patterns of the tape wiring substrate may be electrically connected to substrate pads of the PCB 2000 via a connection terminal, such as a bump or a solder ball. Output wiring patterns of the tape wiring substrate may be electrically connected to panel pads of the display panel 3000 via a connection terminal.

Referring to FIG. 19B, the display apparatus 10000 may include a source driving circuit unit 1000UD, a gate driving circuit unit 1000UG, a timing controller 2100, and a display panel 3000. A plurality of pixel cells C formed in positions where a plurality of source lines SL (or a plurality of data lines) cross a plurality of gate lines GL may be formed in the display panel 3000. The source driving circuit unit 1000UD and the gate driving circuit unit 1000UG may be connected to sub-pixels in the pixel cells C, and may sequentially drive the sub-pixels by applying a source driving signal and a gate driving signal to the sub-pixels. The timing controller 2100 may generate a data signal, a scan signal, a control signal, and the like and control the source driving circuit unit 1000UD and the gate driving circuit unit 1000UG.

The source driving circuit unit 1000UD may correspond to all of the data chip packages 1000D of FIG. 18, and the gate driving circuit unit 1000UG may correspond to all of the gate chip packages 1000G of FIG. 18. Accordingly, the source driving circuit unit 1000UD may include a plurality of source driving chips SD, and the gate driving circuit unit 1000UG may include a plurality of gate driving chips GD. Each of the source driving chip SD and the gate driving chip GD may have the structure of any of the semiconductor chips 100 and 100a to 100e described with reference to FIGS. 3, 6, 7A, 7C, 8A, and 8B.

Figure 20:
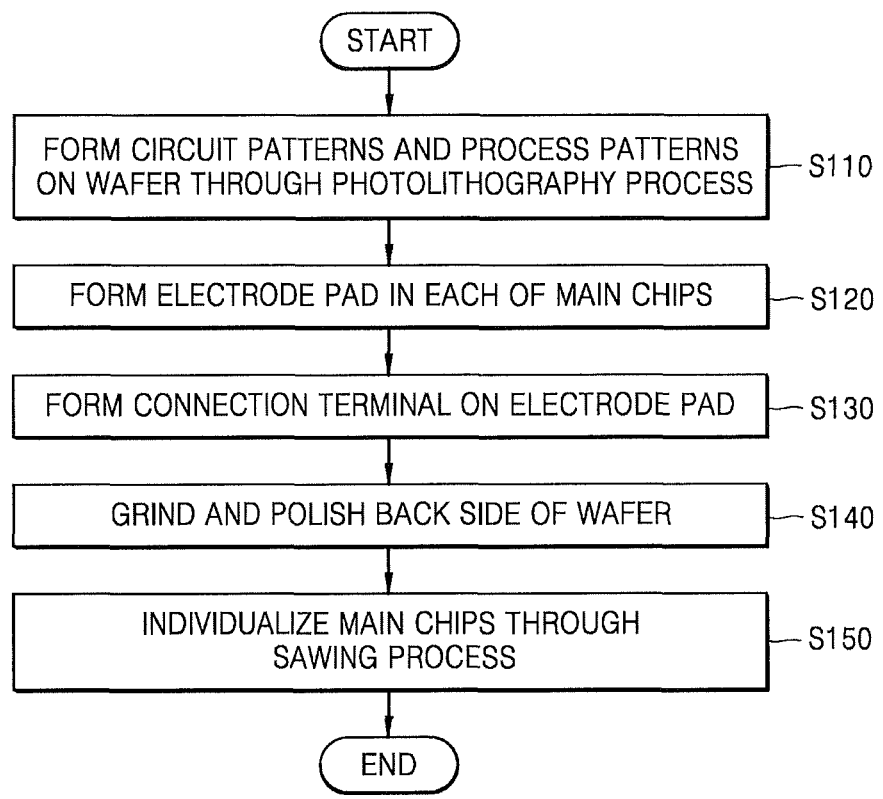
FIG. 20 is a flowchart illustrating a process of manufacturing a semiconductor chip, according to some embodiments.

FIG. 20 is a flowchart illustrating a process of manufacturing a semiconductor chip, according to some embodiments, and FIGS. 21A to 21D are conceptual diagrams corresponding to operations of the manufacturing process of FIG. 20. Descriptions provided above with reference to FIGS. 1 to 19B will be briefly provided or omitted.

Figure 21A:
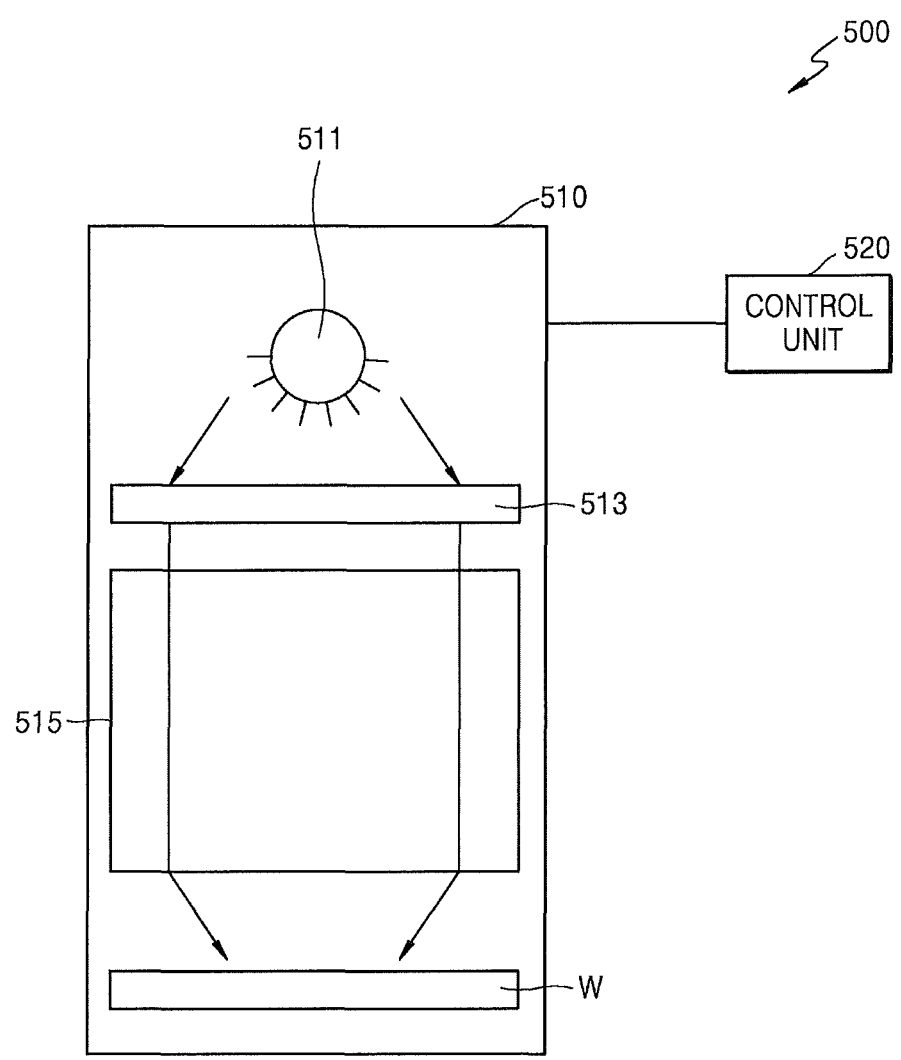
FIGS. 21A to 21D are conceptual diagrams corresponding to operations of the manufacturing process of FIG. 20.
Figure 21B:
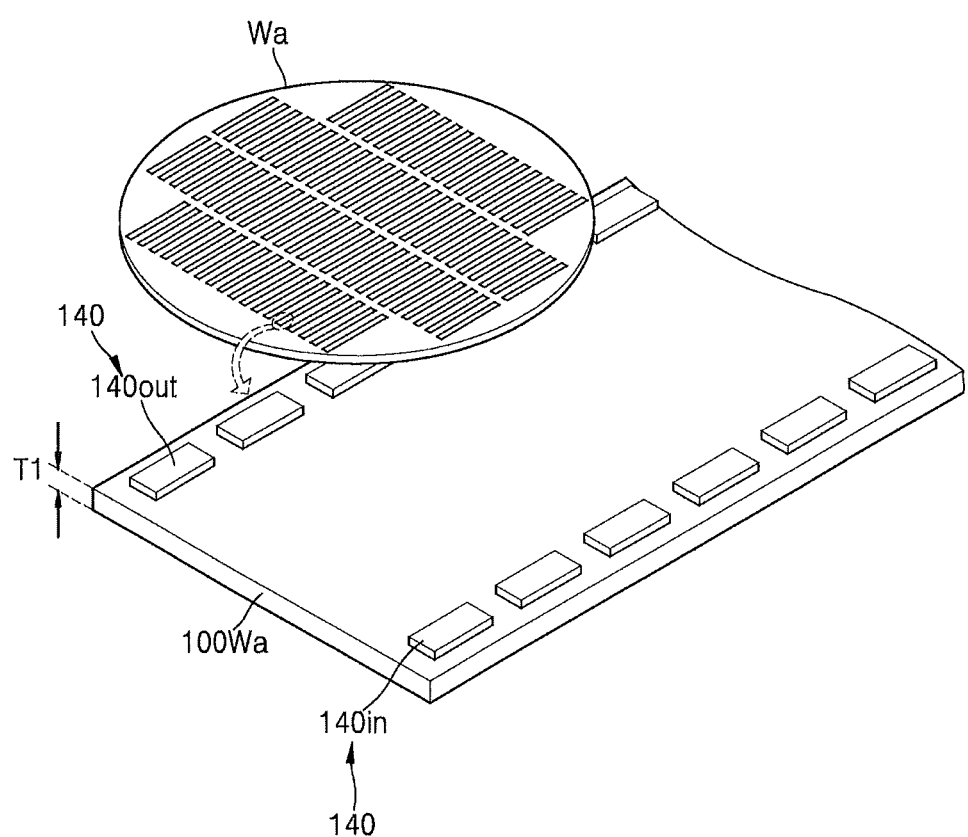

Referring to FIGS. 20, 21A, and 21B, circuit patterns and process patterns are formed on a wafer Wa by using a photolithography process (operation S110). The circuit patterns may be formed in a plurality of main chips 100Wa included in the wafer Wa. For example, the circuit patterns may be driving circuit cells that are formed in the circuit region 110 of the semiconductor chip 100 of FIG. 3. However, the circuit patterns are not limited to driving circuit cells. The process patterns may be process patterns, which are formed in a scribe lane, and process patterns (refer to the process pattern 130 of FIG. 3) that are formed in the main chips 100Wa.

The photolithography process may be performed by exposure equipment 500 as shown in FIG. 21A. The exposure equipment 500 may include an exposure unit 510 for performing exposure and a control unit 520 for controlling an exposure operation of the exposure unit 510. A mask 513 through which exposure light provided from a light source 511 is penetrated may be disposed in the exposure unit 510. An exposure light having an image of a pattern layout formed in the mask 513 may be incident on the wafer Wa, disposed in a stage, by means of a projection lens 515. A layout pattern that allows the process pattern 130 to be included in the main chips 100Wa may be formed in the mask 513.

The photolithography process of operation S110 may include a process of forming patterns on the wafer Wa by performing various semiconductor processes, such as deposition, etching, ion implantation, and cleaning, as well as an exposure process through the exposure equipment 500. The process of forming patterns on the wafer Wa may be a process of forming circuit patterns and the process pattern 130 in the main chips 100Wa of the wafer Wa and forming various process patterns in the scribe lane S/L.

Referring back to FIG. 20, an electrode pad (refer to the electrode pad 120 of FIG. 3) is formed in each of the main chips 100Wa of the wafer Wa (operation S120). The electrode pad may be formed without using an alignment key, for example, the process pattern 130. Accordingly, as described with reference to FIGS. 13A to 14, the top metal layer (refer to the top metal layer 132t of FIG. 13B) of the process pattern 130 may be omitted. If the process pattern 130 has to be used in the formation of the electrode, the top metal layer may be formed to be smaller than a lower metal layer. In this manner, the generation of a bur may be reduced or minimized by omitting the top metal layer or forming the top metal layer to be smaller than the lower metal layer.

Referring to FIGS. 20 and 21B, a connection terminal (refer to the connection terminal 120 of FIG. 13A) such as a bump is formed on the electrode pad (operation S130). Specifically, an input connection terminal 140in may be formed on an input electrode pad (refer to the input electrode pad 120in of FIG. 3), and an output connection terminal 140out may be formed on an output electrode pad (refer to the output electrode pad 120out of FIG. 3). The connection terminal may include, for example, a gold bump. However, the material of the connection terminal 140 is not limited to a gold bump. For example, the connection terminal may include aluminum, copper, or silver which has relatively high electrical conductivity.

After the connection terminal is formed, the thickness of the wafer Wa or the thickness of the main chips 100Wa may have a first thickness T1 that is the same as the thickness of an original wafer.

Figure 21C:
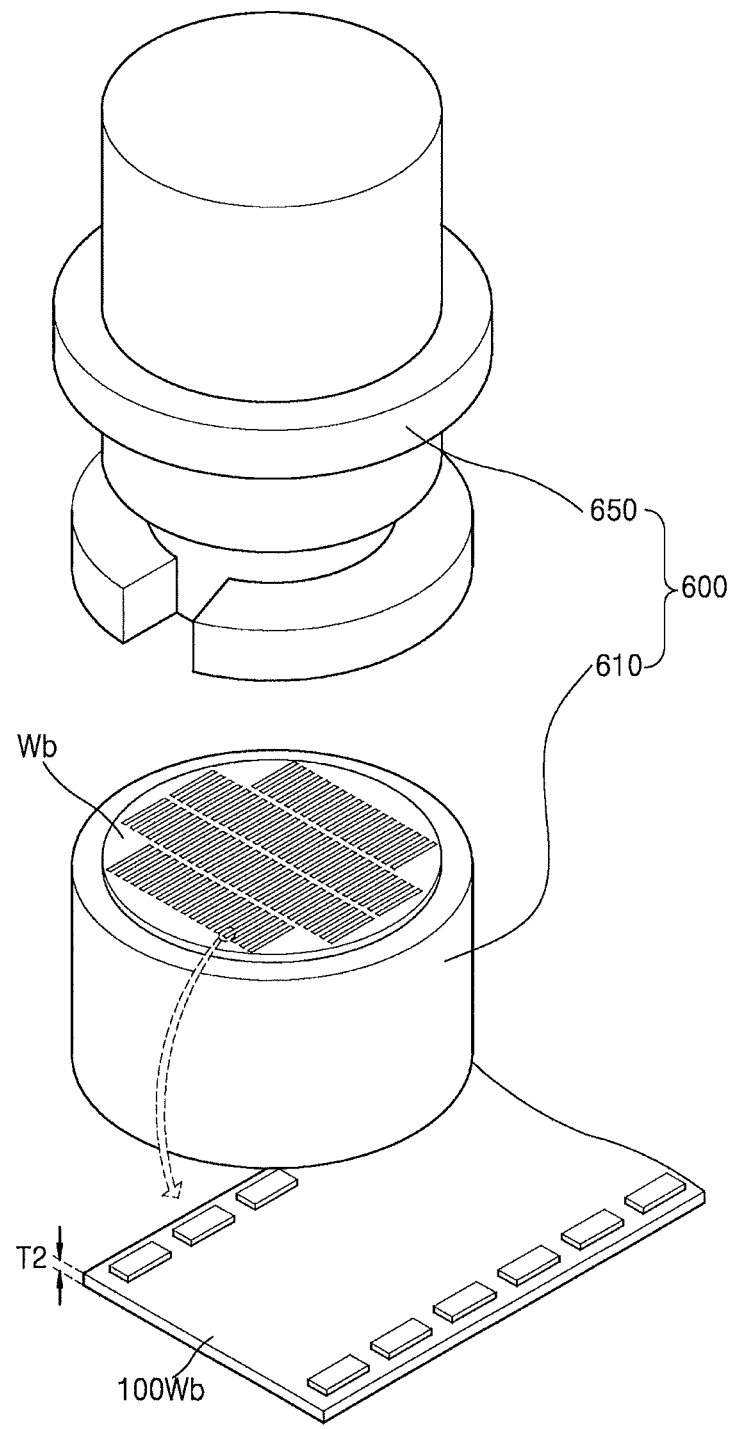

Referring to FIGS. 20 and 21C, the back side of the wafer Wa is grinded and polished after the connection terminal is formed (operation S140). By grinding and polishing the back side of the wafer Wa, the wafer Wb may be thinned and thus the main chips 100Wa in the wafer Wb may also be thinned. For example, after the back side of the wafer Wa is grinded and polished, the thickness of wafer Wb or the thickness of the main chips 100Wa may have a second thickness T2 that is smaller than the first thickness T1 of the wafer Wa.

Figure 21D:
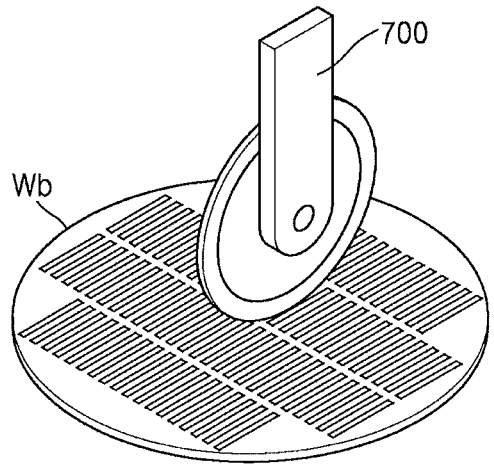

The back side grinding and polishing of the wafer Wa may be performed by fixing the wafer Wa on a rotating chuck 610 of back side processing equipment 600 so that the back side of the wafer Wa faces upward and then processing the back side of the wafer Wa by using a rotational spindle 650. Next, by coating the back side of the grinded and polished wafer Wb with resin, the grinded and polished wafer Wb may be protected from an external physical and chemical damage. In FIG. 21C, a front surface of the wafer Wb is shown as to face upward to correspond to an enlarged view of the main chips 100Wb. Referring to FIGS. 20 and 21D, the main chips 100Wb are individualized through a sawing process after the back side grinding and polishing of the wafer Wa (operation S150). The sawing process may be performed by using a cutter or blade 700 having a diamond blade. The grinded and polished wafer Wb may be stably positioned on an adhesive film of a fixed frame before cutting the wafer Wb through the sawing process. The adhesive film may also fix the main chips just as they are after the cutting of the wafer Wb. Deionized (DI) water may be sprayed during the cutting of the wafer Wb, and the main chips may be separated from each other by rotating a diamond blade at high speed and thus cutting the wafer Wb in the X and Y directions. Each of the separated main chips, that is, individual semiconductor chips, may be the semiconductor chip 100 of FIG. 3. Each of the separated main chips, that is, the individual semiconductor chips, may be any of the semiconductor chips 100a to 100e of FIGS. 6, 7A, 7C, 8A, and 8B.

The semiconductor package 1000, 1000a, or 1000b may be manufactured by mounting the individual semiconductor chip on a tape wiring substrate (refer to the tape wiring substrate 200 of FIG. 15A), a glass substrate (refer to the glass substrate 301 of FIG. 16A), or a tape carrier (refer to the tape carrier 200a of FIG. 17).

While the inventive concepts has been particularly shown and described with reference to embodiments thereof, it will be understood that various changes in form and details may be made therein without departing from the spirit and scope of the following claims.

What is claimed is:

1. A semiconductor chip comprising:
a circuit region disposed in a central part of a rectangle that is elongated in a first direction, the circuit region comprising a plurality of driving circuit cells disposed at predetermined intervals in the first direction;
a plurality of electrode pads disposed around the circuit region; and
a process pattern disposed at at least one of four sides of the rectangle,
wherein the semiconductor chip is one of a plurality of chips separated from a wafer,
wherein an entirety of the process pattern is disposed in the semiconductor chip, or a portion of the process pattern is disposed in a scribe lane of the wafer and another portion of the process pattern is disposed in the semiconductor chip.

2. The semiconductor chip of claim 1, wherein the rectangle comprises long sides having a greater length than short sides thereof, and wherein the entirety of the process pattern is disposed at one of the short sides of the rectangle.

3. The semiconductor chip of claim 1, wherein the rectangle comprises long sides having a greater length than short sides thereof, and wherein the portion of the process pattern is disposed at at least one of the long sides of the rectangle.

4. The semiconductor chip of claim 1,
wherein a width of the process pattern is wider than that of the scribe lane of the wafer.

5. The semiconductor chip of claim 1,
wherein the process pattern corresponds to an alignment key.

6. The semiconductor chip of claim 1, wherein the rectangle comprises long sides having a greater length than short sides thereof, and wherein widths of short sides of the rectangle in the semiconductor chip are greater than those of a semiconductor chip that does not include the process pattern.

7. A semiconductor chip comprising:
a circuit region disposed in a central part of a rectangle, the circuit region comprising circuit patterns; and
a process pattern disposed around the circuit region and at at least one of four sides of the rectangle, wherein the semiconductor chip is one of a plurality of chips separated from a wafer,
wherein an entirety of the process pattern is disposed in the semiconductor chip, or a portion of the process pattern is disposed in a scribe lane of the wafer and a portion of the process pattern is disposed in the semiconductor chip.

8. The semiconductor chip of claim 7,
wherein as the entirety of the process pattern or the portion thereof is disposed in the semiconductor chip, a width of the scribe lane of the wafer decreases and an area of the semiconductor chip increases.

9. A semiconductor chip, comprising:
a circuit region comprising circuit patterns therein that are arranged along a first direction;
conductive electrode pads that are electrically coupled to the circuit patterns and are arranged between a periphery of the circuit region and an edge of the semiconductor chip that extends along the first direction; and
at least one process pattern on the semiconductor chip adjacent the periphery and outside of the circuit region, wherein the at least one process pattern is electrically isolated from the circuit patterns and the conductive electrode pads, wherein:
the at least one process pattern extends along the first direction; and
the at least one process pattern is arranged between the conductive electrode pads and the edge of the semiconductor chip, or is arranged between an outermost one of the circuit patterns and an adjacent edge of the semiconductor chip that extends along a second direction that is perpendicular to the first direction.

10. The semiconductor chip of claim 9, wherein the edge of the semiconductor chip defines a boundary of a scribe lane of a wafer from which the semiconductor chip was separated, and wherein the at least one process pattern extends along the edge and comprises a portion of a main process pattern.

11. The semiconductor chip of claim 10, wherein, along the second direction, a width of the at least one process pattern is indicative of a reduction in a width of the scribe lane.

12. The semiconductor chip of claim 9, wherein:
the edge comprises one of opposing edges of the semiconductor chip that define respective boundaries of respective scribe lanes of a wafer from which the semiconductor chip was separated;
the at least one process pattern comprises first and second process patterns extending along the opposing edges of the semiconductor chip, respectively; and
along the second direction, a sum of respective widths of the first and second process patterns is indicative of a reduction in a width of the scribe lane.

13. The semiconductor chip of claim 9, wherein the edge of the semiconductor chip defines a boundary of a scribe lane of a wafer from which the semiconductor chip was separated, and wherein the at least one process pattern is arranged at the adjacent edge and comprises an entirety of a main process pattern.

14. The semiconductor chip of claim 13, wherein the at least one process pattern comprises an alignment key having a width along the second direction that is greater than that of the scribe lane.

15. The semiconductor chip of claim 9, wherein the semiconductor chip comprises a display driver integrated circuit (DDI), wherein the circuit patterns comprise driving circuit cells, and wherein the conductive electrode pads comprise input/output pads having respective connection terminals that are configured to provide electrical connections between the driving circuit cells and wiring patterns on a support substrate.

16. The semiconductor chip of claim 9, wherein the at least one process pattern comprises multiple layers corresponding to a number of metal layers of the semiconductor chip, and wherein top layer of the multiple layers is smaller than a lower layer thereof in at least one dimension.

17. The semiconductor chip of claim 9, wherein the at least one process pattern comprises multiple layers corresponding to less than a number of metal layers of the semiconductor chip.

* * * * *